US009768186B2

(12) United States Patent
Shimabukuro et al.

(10) Patent No.: US 9,768,186 B2
(45) Date of Patent: *Sep. 19, 2017

(54) THREE DIMENSIONAL MEMORY DEVICE HAVING WELL CONTACT PILLAR AND METHOD OF MAKING THEREOF

(71) Applicant: SANDISK TECHNOLOGIES LLC, Plano, TX (US)

(72) Inventors: Seiji Shimabukuro, Yokkaichi (JP); Ryoichi Honma, Yokkaichi (JP); Hiroyuki Ogawa, Yokkaichi (JP); Yuki Mizutani, San Jose, CA (US); Fumiaki Toyama, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/216,941

(22) Filed: Jul. 22, 2016

(65) Prior Publication Data

US 2016/0329341 A1  Nov. 10, 2016

Related U.S. Application Data

(63) Continuation of application No. 14/491,026, filed on Sep. 19, 2014, now Pat. No. 9,412,749.

(51) Int. Cl.
*G11C 16/04* (2006.01)
*H01L 27/115* (2017.01)
(Continued)

(52) U.S. Cl.
CPC .... *H01L 27/11556* (2013.01); *H01L 23/5226* (2013.01); *H01L 27/1157* (2013.01);
(Continued)

(58) Field of Classification Search
CPC ............ G11C 16/0483; G11C 2213/71; G11C 16/0408; G11C 5/02; H01L 27/11582;
(Continued)

(56) References Cited

U.S. PATENT DOCUMENTS 5,915,167 A  6/1999 Leedy
8,395,190 B2  3/2013 Shim et al.
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Ly D Pham
(74) *Attorney, Agent, or Firm* — The Marbury Law Group PLLC

(57) ABSTRACT

A monolithic three dimensional memory device includes a semiconductor substrate having a major surface and a doped well region of a first conductivity type extending substantially parallel to the major surface of the semiconductor substrate, a plurality of NAND memory strings extending substantially perpendicular to the major surface of the semiconductor substrate, and a plurality of substantially pillar-shaped support members extending substantially perpendicular to the major surface of the semiconductor substrate, each support member including an electrically insulating outer material surrounding an electrically conductive core material that extends substantially perpendicular to the major surface of the semiconductor substrate and electrically contacting the doped well region.

17 Claims, 28 Drawing Sheets

(51) Int. Cl.

| | | |
|---|---|---|
| H01L 21/768 | (2006.01) | |
| H01L 23/528 | (2006.01) | |
| H01L 29/788 | (2006.01) | |
| H01L 29/06 | (2006.01) | |
| H01L 27/11556 | (2017.01) | |
| H01L 27/11524 | (2017.01) | |
| H01L 27/1157 | (2017.01) | |
| H01L 29/66 | (2006.01) | |
| H01L 27/11582 | (2017.01) | |
| H01L 27/11519 | (2017.01) | |
| H01L 27/11565 | (2017.01) | |
| H01L 27/11575 | (2017.01) | |
| H01L 23/522 | (2006.01) | |
| H01L 27/11551 | (2017.01) | |
| G11C 5/02 | (2006.01) | |
| H01L 29/792 | (2006.01) | |

(52) U.S. Cl.
CPC .. *H01L 27/11519* (2013.01); *H01L 27/11524* (2013.01); *H01L 27/11565* (2013.01); *H01L 27/11575* (2013.01); *H01L 27/11582* (2013.01); *H01L 29/66825* (2013.01); *H01L 29/66833* (2013.01); *G11C 5/02* (2013.01); *G11C 16/0408* (2013.01); *G11C 16/0483* (2013.01); *G11C 2213/71* (2013.01); *H01L 27/11551* (2013.01); *H01L 29/7889* (2013.01); *H01L 29/7926* (2013.01)

(58) Field of Classification Search
CPC ............ H01L 29/7926; H01L 27/1157; H01L 27/11578; H01L 29/7889; H01L 29/66825; H01L 27/11524; H01L 27/11551
USPC .......... 365/185.17, 185.05, 51, 63; 257/312; 438/257, 593, 268
See application file for complete search history.

(56) References Cited

U.S. PATENT DOCUMENTS

| | | |
|---|---|---|
| 2006/0110880 A1 | 5/2006 | Yuan |
| 2010/0133598 A1* | 6/2010 | Chae ............... H01L 27/11551 257/314 |
| 2010/0213527 A1 | 8/2010 | Shim et al. |
| 2010/0254191 A1 | 10/2010 | Son et al. |
| 2011/0198687 A1 | 8/2011 | Lee |
| 2011/0248327 A1 | 10/2011 | Son et al. |
| 2012/0098050 A1 | 4/2012 | Shim et al. |
| 2014/0042519 A1 | 2/2014 | Lee |
| 2014/0092686 A1 | 4/2014 | Shim et al. |
| 2014/0192594 A1 | 7/2014 | Lue |
| 2014/0231954 A1* | 8/2014 | Lue ............... H01L 27/11524 257/528 |
| 2015/0055413 A1 | 2/2015 | Alsmeier |
| 2015/0076586 A1 | 3/2015 | Rabkin et al. |
| 2015/0115455 A1* | 4/2015 | Chen ............... H01L 21/76895 257/773 |
| 2015/0155292 A1* | 6/2015 | Son ............... H01L 27/11551 257/321 |
| 2015/0179662 A1 | 6/2015 | Makala et al. |
| 2015/0187425 A1* | 7/2015 | Nam .............. G11C 16/14 365/185.2 |
| 2015/0236038 A1 | 8/2015 | Pachamuthu et al. |
| 2016/0049421 A1 | 2/2016 | Zhang et al. |
| 2016/0086969 A1 | 3/2016 | Zhang et al. |

OTHER PUBLICATIONS

International Searching Authority, Invitation to Pay Additional Fees and Partial International Search for PCT/US2015/048513, dated Dec. 1, 2015, 8 pages.
International Preliminary Report on Patentability and Written Opinion of the International Searching Authority for International Patent Application No. PCT/US2015/048513, mailed Mar. 30, 2017, 12 pages.

* cited by examiner

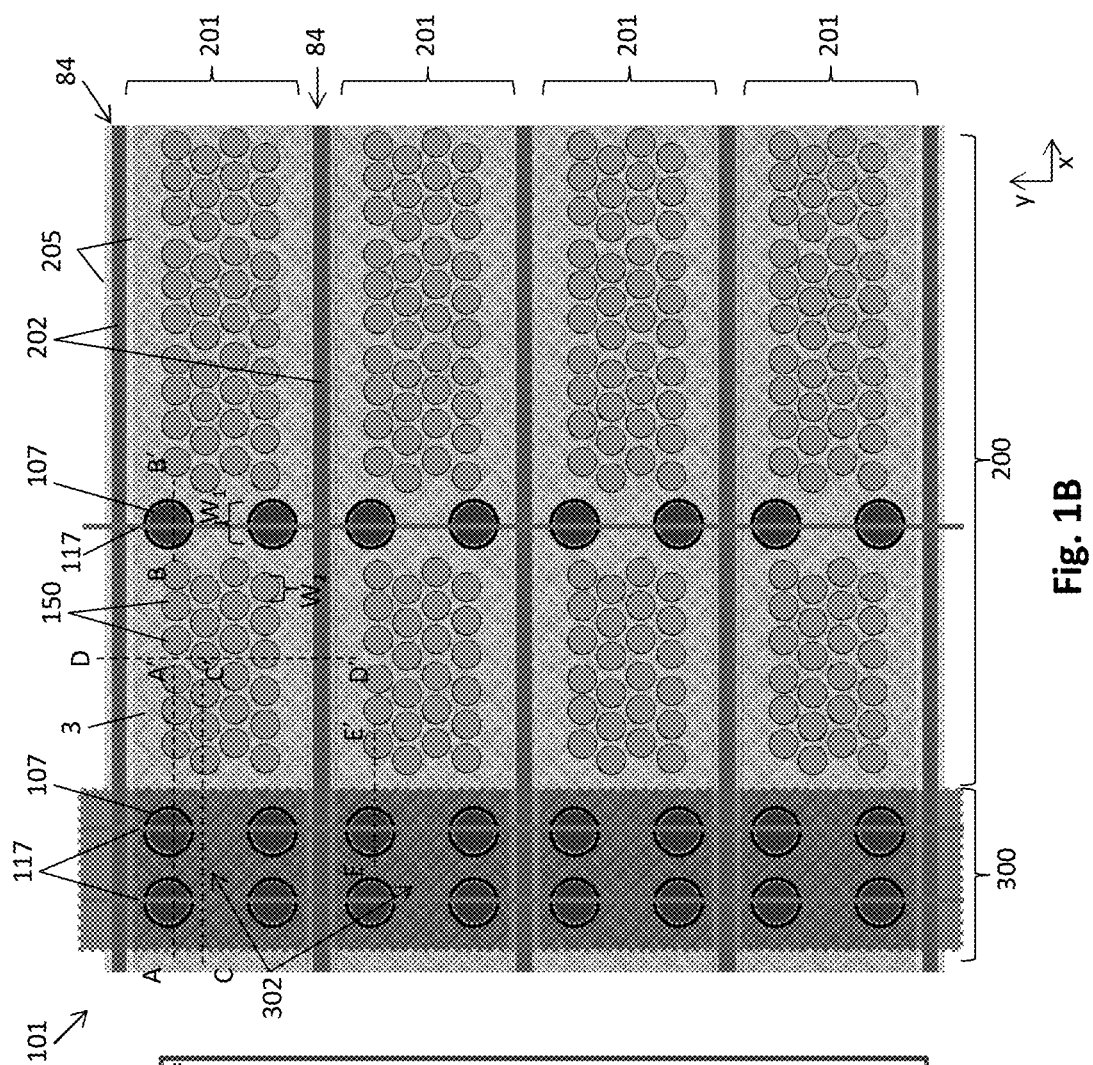
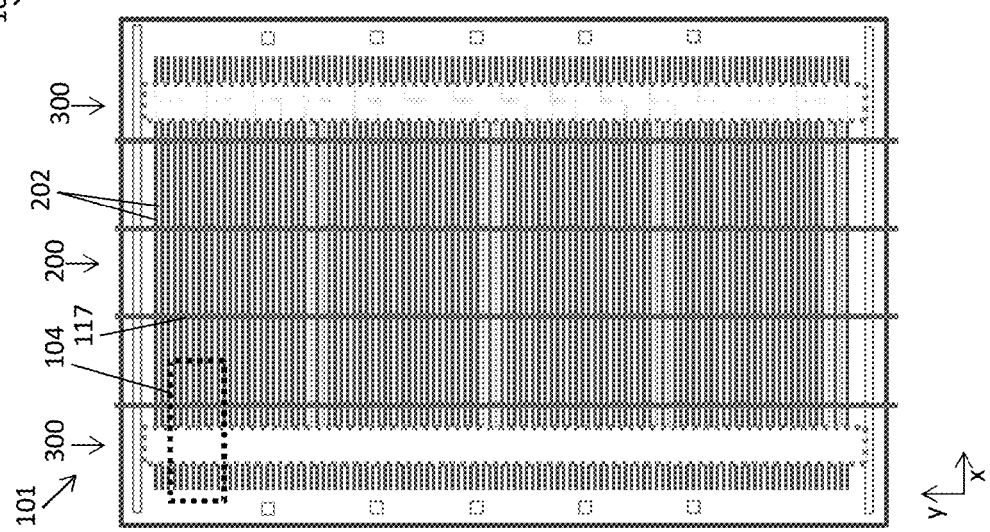

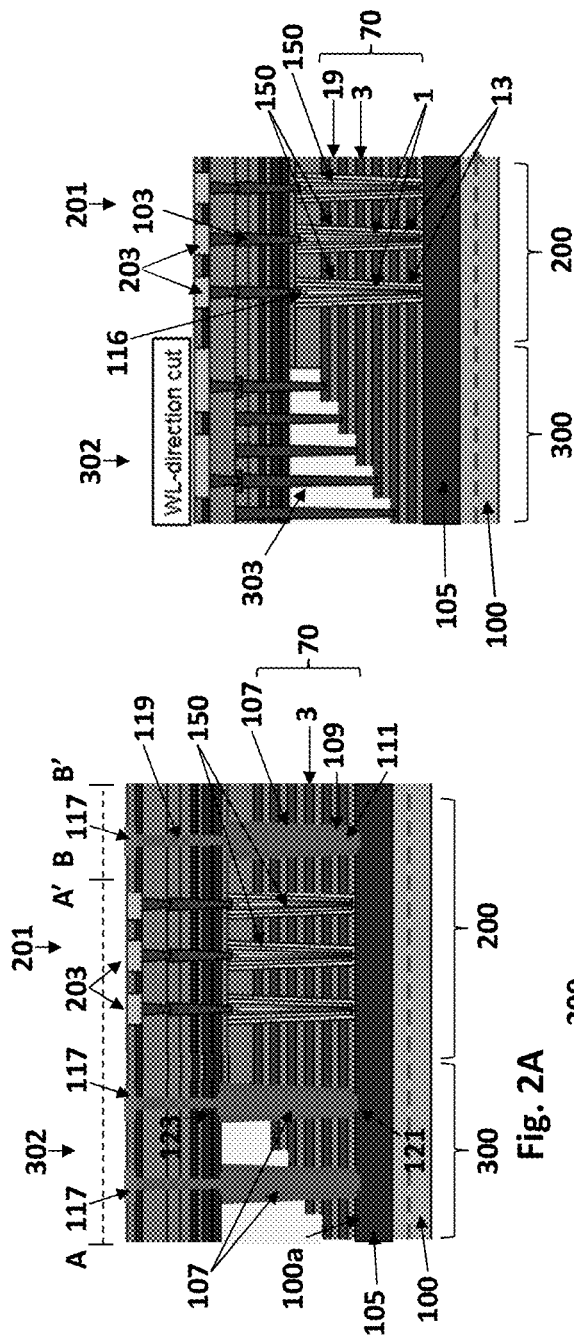
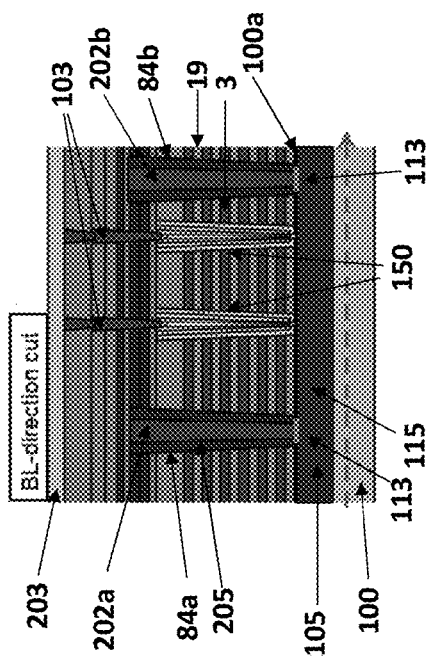

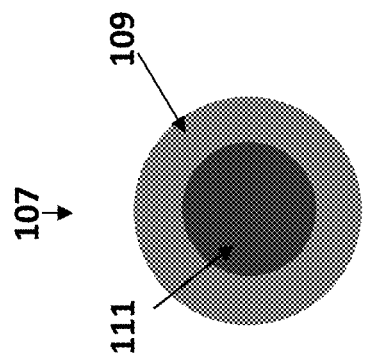
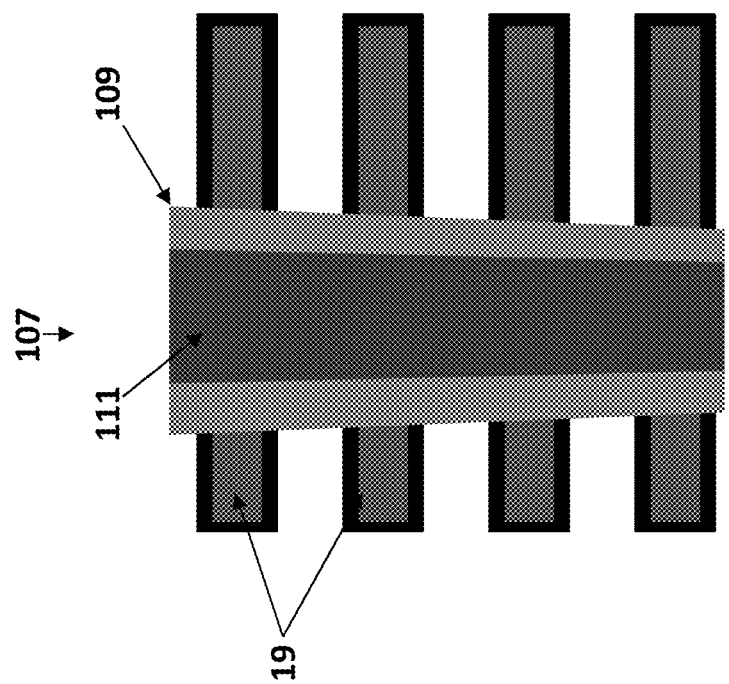

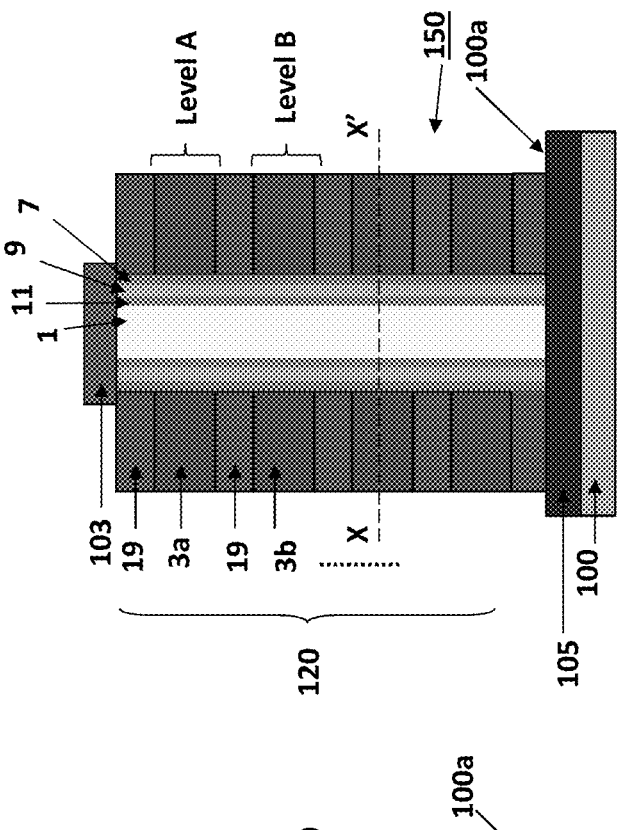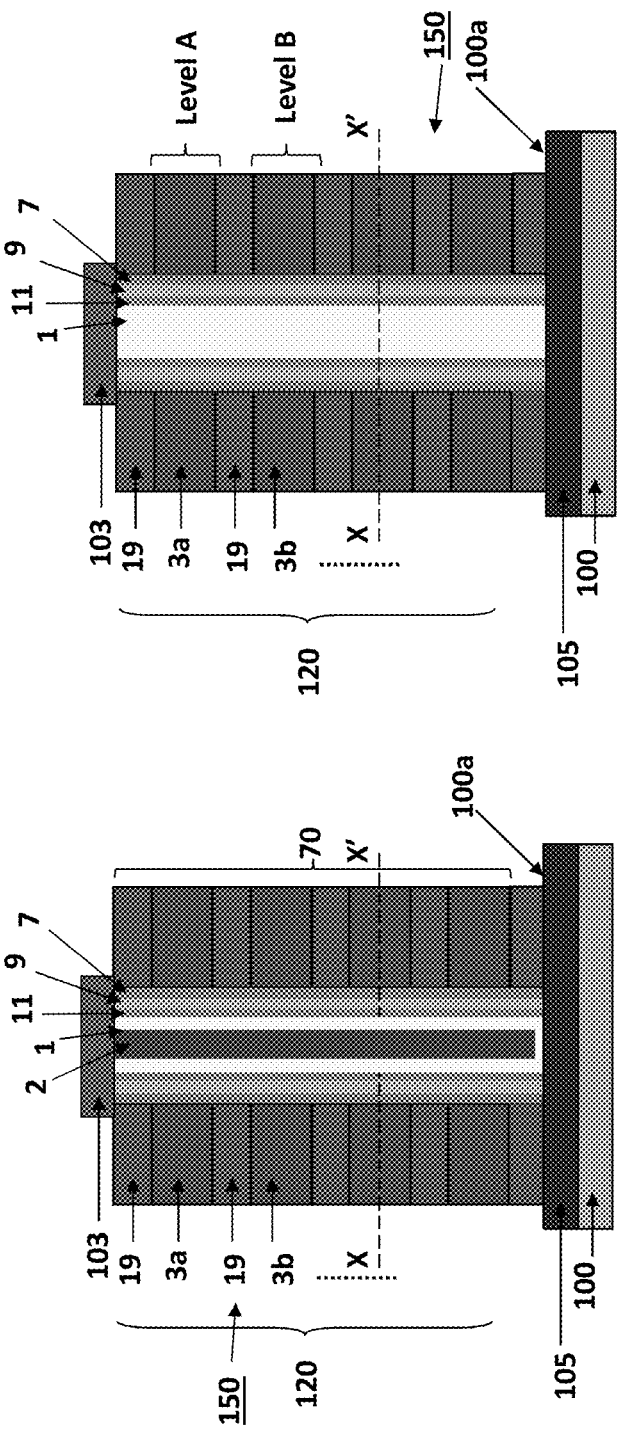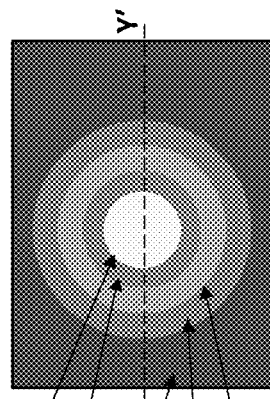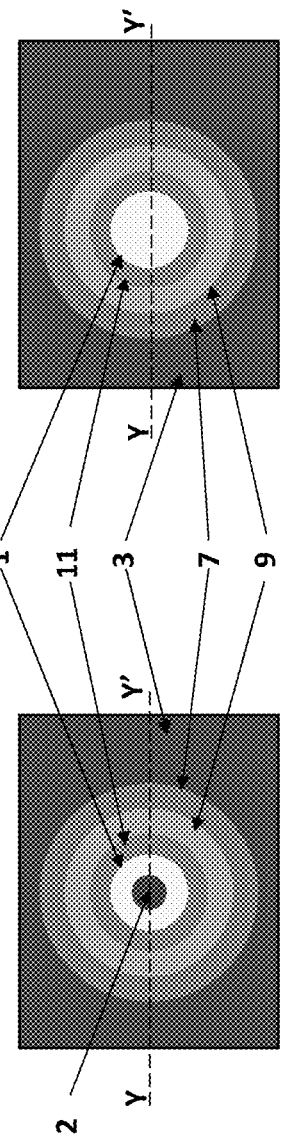

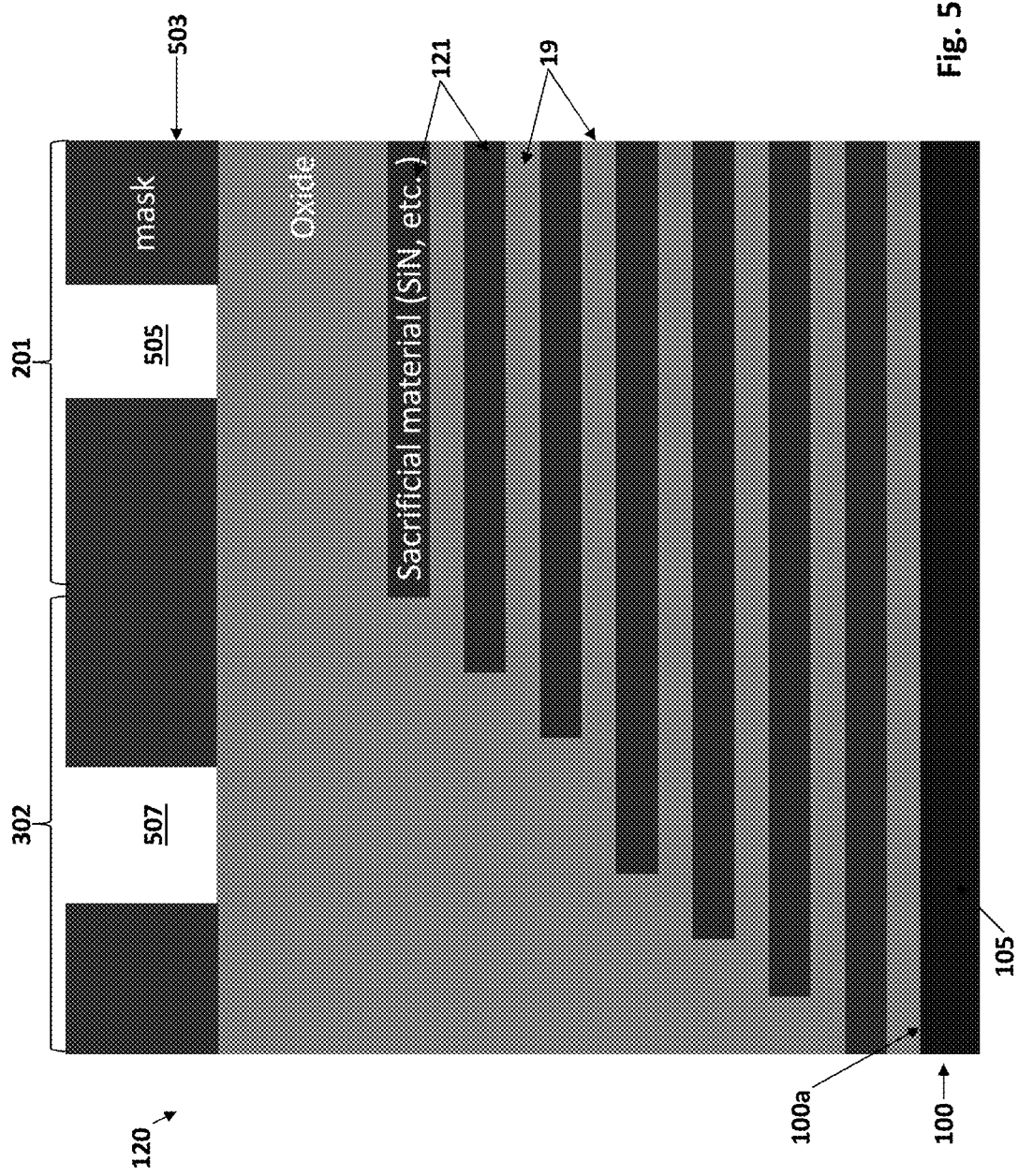

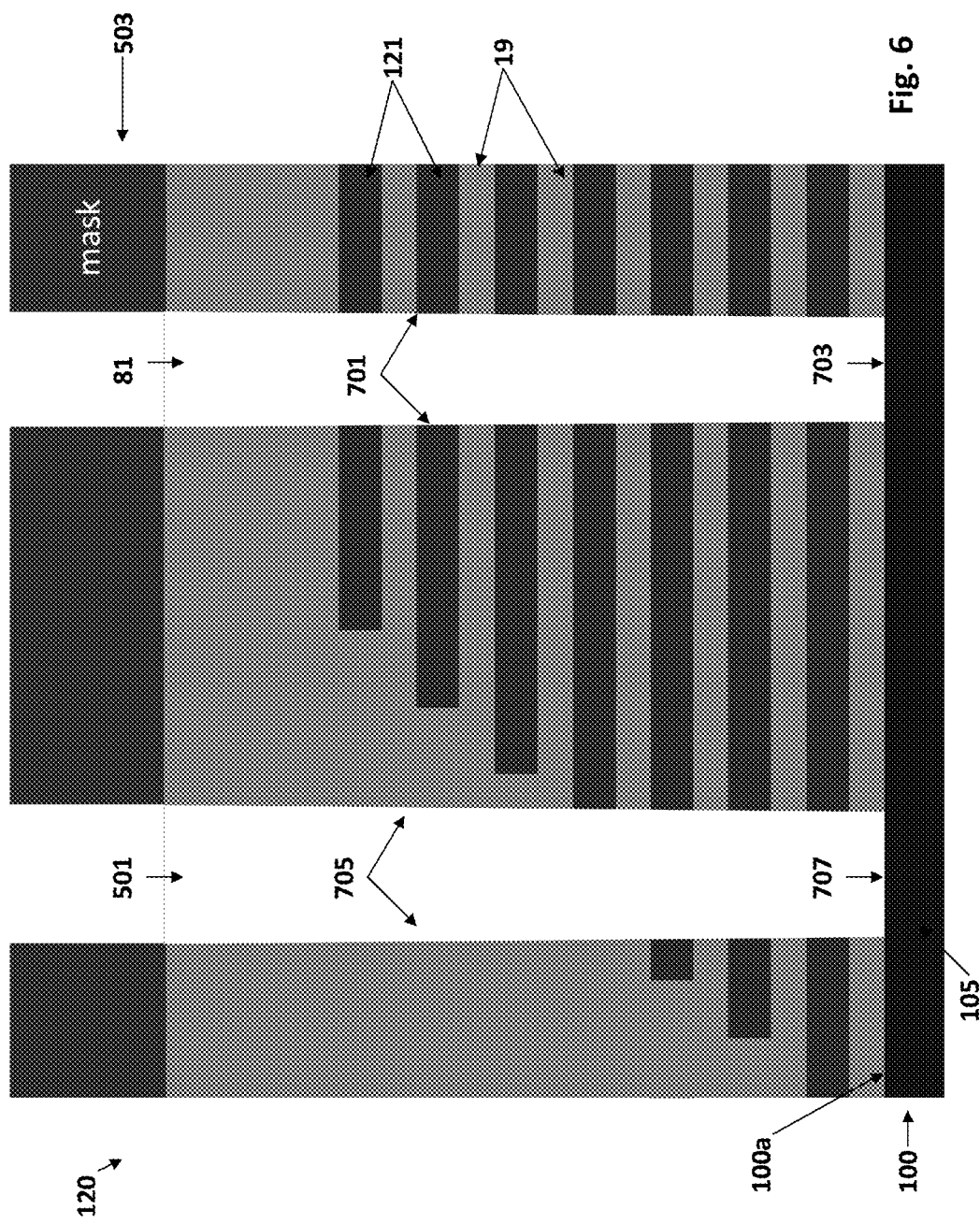

THREE DIMENSIONAL MEMORY DEVICE HAVING WELL CONTACT PILLAR AND METHOD OF MAKING THEREOF

FIELD

The present disclosure relates generally to the field of semiconductor devices and specifically to three dimensional memory devices, such as vertical NAND strings, and other three dimensional devices and methods of making thereof.

BACKGROUND

Three dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

An embodiment relates to a monolithic three dimensional memory device that includes a semiconductor substrate having a major surface and a doped well region of a first conductivity type extending substantially parallel to the major surface of the semiconductor substrate, a plurality of NAND memory strings extending substantially perpendicular to the major surface of the semiconductor substrate, and a plurality of substantially pillar-shaped support members extending substantially perpendicular to the major surface of the semiconductor substrate, each support member including an electrically insulating outer material surrounding an electrically conductive core material that extends substantially perpendicular to the major surface of the semiconductor substrate and electrically contacting the doped well region.

Another embodiment relates to a method of making a monolithic three dimensional memory device that includes forming a stack of alternating layers of a first material and a second material different than the first material over a major surface of a substrate, etching the stack to form a plurality of memory openings and at least one support pillar opening in the stack, forming a plurality of NAND memory strings in the plurality of memory openings, and forming a support pillar in the support pillar opening, where the support pillar includes an electrically insulating material located over a sidewall of the support pillar opening and an electrically conductive material that is surrounded by the electrically insulating material.

BRIEF DESCRIPTION OF THE DRAWINGS

FIG. 1A is a schematic top view of a memory device according to embodiments of the disclosure.

FIG. 1B is an enlarged schematic top view of a portion of the memory device of FIG. 1A.

FIG. 2A is a side cross sectional composite view of a portion of a memory device in the word line direction taken along lines A-A' and B-B' in FIG. 1B.

FIG. 2B is a side cross sectional view of a portion of a memory device in the word line direction taken along line C-C' in FIG. 1B.

FIG. 2C is a side cross-sectional view of a portion of a memory device in the bit line direction taken along line D-D' in FIG. 1B.

FIG. 3A is a side cross sectional view of a pillar shaped support member having an electrically conductive core material.

FIG. 3B is a top view of the pillar shaped support member.

FIGS. 4A and 4B are respectively side cross sectional and top cross sectional views of a NAND string of one embodiment. FIG. 4A is a side cross sectional view of the device along line Y-Y' in FIG. 4B, while FIG. 4B is a side cross sectional view of the device along line X-X' in FIG. 4A.

FIGS. 4C and 4D are respectively side cross sectional and top cross sectional views of a NAND string of another embodiment. FIG. 4C is a side cross sectional view of the device along line Y-Y' in FIG. 4D, while FIG. 4D is a side cross sectional view of the device along line X-X' in FIG. 4C.

FIGS. 5-23 are side cross sectional views illustrating steps in an embodiment method of making the device illustrated in FIGS. 1A-4D along line E-E' in FIG. 1B.

DETAILED DESCRIPTION

Figure 7:
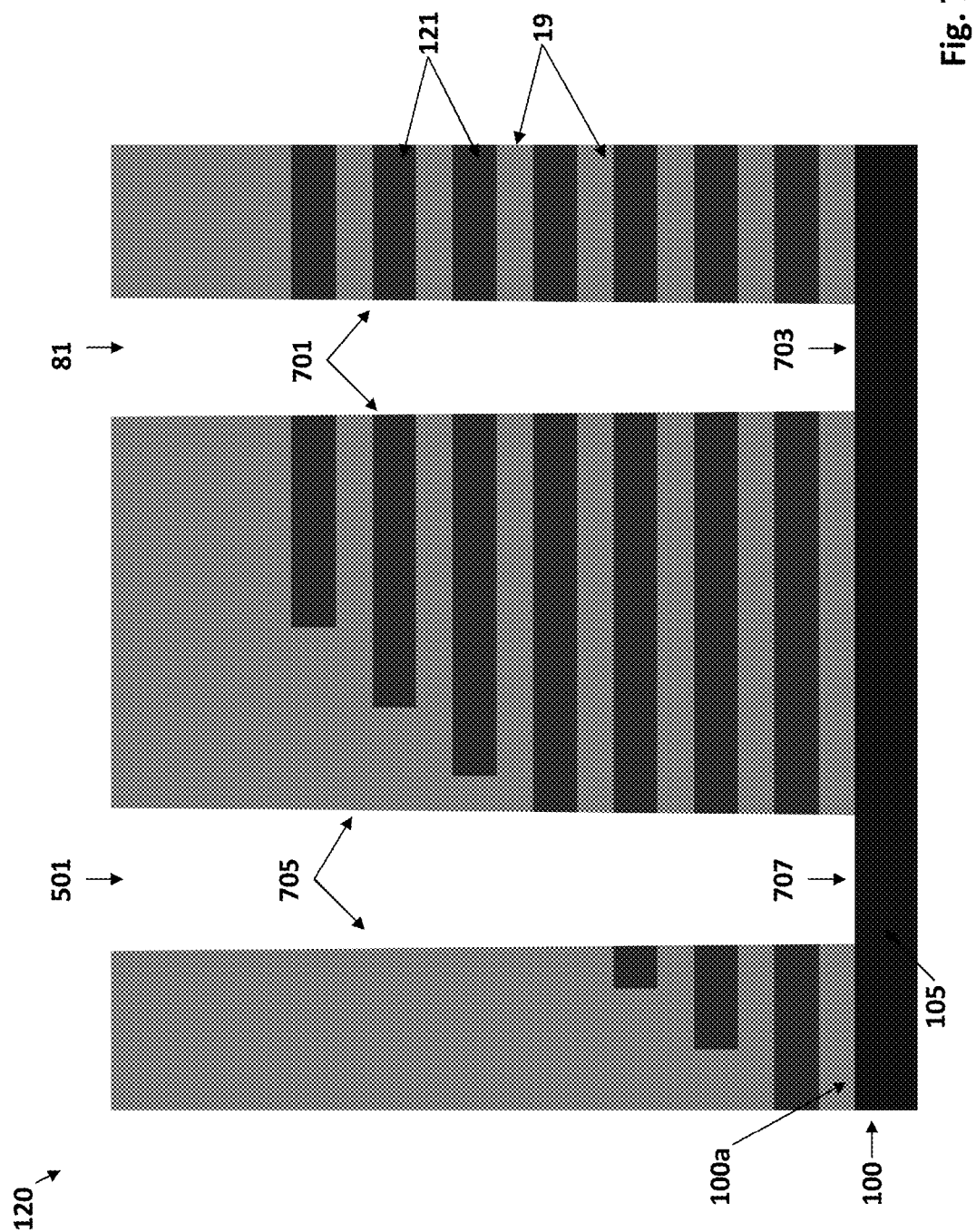

Embodiments of the present disclosure will be described below with reference to the accompanying drawings. It should be understood that the following description is intended to describe various embodiments of the disclosure, and not to limit the disclosure.

The embodiments of the disclosure may provide a monolithic, three dimensional array of memory devices, such as an array of vertical NAND strings. The NAND strings may be vertically oriented, such that at least one memory cell is located over another memory cell. The array may allow vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

FIGS. 1A and 1B are schematic top views of a memory device 101 according to an embodiment of the disclosure. FIG. 1B is an enlarged view of the region 104 indicated by dashed lines in FIG. 1A. FIGS. 2A-2C are side cross sectional views of portions of the memory device 201. FIG. 2A is a side cross sectional composite view of the memory device 101 in the word line direction taken along lines A-A' and B-B' in FIG. 1B. FIG. 2B is a side cross sectional view of the memory device 101 also in the word line direction taken along line C-C' in FIG. 1B. FIG. 2C is a side cross-sectional view of the memory device 101 in the bit line direction taken along line D-D' in FIG. 1B. In various embodiments, the memory device 101 may include substantially pillar-shaped support members 107 extending substantially perpendicular to the major surface 100a of a semiconductor substrate 100, where each support member 107 includes an electrically insulating outer material 109 surrounding an electrically conductive core material 111 that extends substantially perpendicular to the major surface 100a of the substrate 100 and electrically contacts a doped well region 105 (e.g., p-well region) of the substrate 100. A substantially pillar-shaped support member 107 includes a support member of any shape in cross section and which extends substantially vertically (e.g., within 20 degrees of perpendicular to the major surface of the substrate 100), and which has a larger height in the vertical direction than a width (e.g., diameter for a cylindrical support member 107) in the horizontal direction which is used as a support for the layers of the stack 120.

As shown in FIGS. 1A-1B, the memory device 101 may include peripheral regions 300 and at least one device region 200 between the peripheral regions 300. The memory device 101 may be a monolithic three dimensional memory device that may be formed over a major surface 100a of a semiconductor substrate 100 (e.g., silicon substrate), as shown in FIGS. 2A-2C. The memory device 101 may comprise a plurality of electrically conductive source lines 202 which may be elongated in a first (i.e., x-axis) direction substantially parallel to the major surface 100a of the substrate 100. The source lines 202 may be located within insulated slit trenches 84 as shown in FIGS. 1B and 2C. The source lines 202 may be spaced apart from one another along the y-axis (e.g., bit line) direction and extend parallel to one another in the x-axis (e.g. word line) direction, as shown in FIGS. 1A-1B. Active memory cell areas 201 may be located in the device region 200 between pairs of source lines 202, as shown in FIG. 1B.

Each of the active memory cell areas 201 may contain a plurality of vertical NAND strings 150 according to one embodiment of the disclosure. Each NAND string may comprise a substantially pillar-shaped structure extending substantially perpendicular to the major surface 100a of the substrate 100 and may include a plurality memory device levels, as shown in FIG. 2B. Each NAND string 150 may contain at least one memory film 13 which is located adjacent to a semiconductor channel 1 in the memory device levels 70, as shown in FIG. 2B. Specifically, the memory film 13 may be located between the semiconductor channel 1 and a plurality of control gate electrodes, which may each comprise or may be electrically continuous with an electrically conductive word line 3 that extends within each of the memory levels 70 as described below. The memory film 13 may include a tunnel dielectric 11, a charge storage region(s) 9 (e.g., a dielectric charge trapping layer or floating gates), and a blocking dielectric 7, as described below with reference to FIGS. 4A-4C.

In embodiments, the peripheral regions 300 may include word line connection regions 302 containing a plurality of word line contacts 303 which contact respective stepped portions of the plurality of electrically conductive word lines 3, as shown in FIG. 2B. The word lines 3 may comprise a plurality of vertically separated fingers that may extend from a word line connection region 302 into an active memory cell area 201 (i.e., between a pair of source lines 202a, 202b), as shown in FIGS. 1B and 2C. Each word line 3 may extend in a different device level 70 adjacent to the plurality of vertical NAND strings 150 within the active memory cell area 201. A plurality of insulating layers 19 may extend substantially parallel to the major surface 100a of the substrate 100 between the respective word lines 3. An insulating material 205 may extend adjacent to the source lines 202a, 202b in the slit trenches 84a, 84b and electrically insulate the source lines 202a, 202b from the respective word lines 3 in the active memory cell area 201, as shown in FIG. 2C.

In embodiments, the substrate 100 may have a doped well region 105 of a first conductivity type extending substantially parallel to the major surface 100a of the semiconductor substrate 100, as shown in FIGS. 2A-2C. The doped well region 105 may extend over a substantial area, such as at least about 50% of the area of the substrate 100 in the peripheral 300 and device 200 region(s). In embodiments, the doped well region 105 may comprise a p-well region.

A source region 113 may be located at the bottom of each of the slit trenches 84a, 84b and may be in electrical contact with a respective source line 202a, 202b. The source regions 113 may comprise regions of the substrate 100 having an opposite conductivity type than the conductivity type of the doped well region 105 (e.g., the source region 113 may be n-type when the doped well region 105 is a p-well region). In embodiments, the source region 113 may be formed by implanting the substrate 100 through the trench 84 (e.g., via ion implantation) to provide the source region 113 of the substrate 100 having a second conductivity type opposite the first conductivity type of the doped well region 105 of the substrate 100. The source line 202 may then be formed in the trench 84 in electrical contact with the source region 113.

In embodiments, each of the source lines 202 (e.g., source side electrodes) may be electrically coupled via the source region 113 to the semiconductor channel 1 of the NAND strings 150 via a semiconductor channel portion 115 that extends substantially parallel to the major surface 100a of the substrate 100 (e.g., within the doped well region 105) and contacts the semiconductor channel 1 from below the device levels 70, as shown in FIG. 2C.

The memory device 101 may also include drain electrodes 103 which contact the semiconductor channel 1 of the NAND strings 150 via a drain region 116 from above the device levels 70, as shown in FIGS. 2B-2C. Bit lines 203 may extend above the device levels 70 in a direction that is substantially perpendicular to the source lines 202 and contact the drain electrodes 103.

In embodiments, it may be desirable to form electrical contacts to the doped well region 105 (e.g., p-well region) of the substrate 100 in the memory device 101. The electrical contacts may be used to selectively electrically bias the well region 105 (e.g., biased at a positive voltage, e.g., 15-25V, during an erase operation of the NAND cells) in order to increase the potential in the semiconductor channel portions 115, 1 of the memory device 101. At other times, the doped well region may be biased at zero volts. The present inventors realized that it may be challenging to form electrical contacts to the doped well region 105 without taking up an unreasonably large area of the device 101 and/or otherwise interfering with the operation of the memory device 101 (e.g., by increasing noise in the device).

Various embodiments include providing a plurality of substantially pillar-shaped support members 107 extending substantially perpendicular to the major surface 100a of the substrate 100. Each of the support members 107 may include an electrically insulating outer material 109 which surrounds an electrically conductive core material 111. The electrically insulating outer material 109 may comprise any suitable insulating material (e.g., an oxide or nitride material, such as silicon oxide, silicon nitride or silicon oxynitride). The core material 111 may comprise any suitable electrically conductive material, such as a metal material (e.g., a metal or metal alloy, including a metal nitride or metal silicide) or a doped semiconductor material. The conductive core material 111 may extend generally perpendicular to the major surface 100a of the substrate 100 and may electrically contact the doped well region 105, as shown in FIG. 2A. The electrically insulating outer material 109 may electrically insulate the conductive core material 111 from the conductive word lines 3 which may extend adjacent to the support member 107 as shown in FIG. 2A.

As shown in FIG. 1B, each of the substantially pillar-shaped support members 107 may have a width ($W_1$) that is greater than a width ($W_2$) of the substantially pillar shaped NAND strings 150. In this embodiment, the substantially pillar-shaped support members 107 and the substantially pillar-shaped NAND strings 150 have a generally circular cross-section shape when viewed from the top, although it will be understood that the pillar-shaped support members 107 and/or the pillar-shaped NAND strings 150 may have other cross-section shapes, such as ovoid, polygonal or irregular cross-section shapes. The widths $W_1$, $W_2$ of the pillar-shaped support members 107 and/or the pillar-shaped NAND strings 150 may also taper along their length (e.g., between a first end distal to the major surface 100a of the substrate 100 and a second end proximate to the major surface 100a of the substrate 100, as shown in FIG. 2A). As used herein, the pillar-shaped support members 107 having a width ($W_1$) that is greater than a width ($W_2$) of the substantially pillar shaped NAND strings 150 means that within a given plane above and extending substantially parallel to the major surface 100a of the substrate 100, the width ($W_1$) of the support member 107 is greater than the width of the NAND string 150.

In some embodiments, at least one substantially pillar-shaped support member 107 may be located within an active memory cell area 201 of the device region 200, as shown in FIGS. 1B and 2A. The support member 107 may be located between first and second sets of one or more NAND strings 150 (i.e., NAND strings 150 are located on the left and right sides of the support members 107 within the active memory cell areas 201 as shown in FIG. 1B). The support member 107 may extend through the plurality of vertically separated word lines 3 (i.e., word line "fingers") within the active memory cell area 201, as shown in FIG. 2A.

In other embodiments, at least one substantially pillar-shaped support member 107 may be located within a word line connection region 302 in the peripheral region 300 of the device 101, as shown in FIGS. 1B and 2A. In yet other embodiments, the support members are located in both region 302 and area 201, as shown in FIGS. 1B and 2A.

Referring to FIGS. 1A, 1B and 2A, one or more electrically conductive shunt lines 117 may extend substantially parallel to the major surface 100a of the substrate 100. A plurality of shunt lines 117 may extend parallel to one another in the y-axis (e.g. bit line) direction, as shown in FIGS. 1A-1B. Thus, the shunt lines 117 may extend substantially parallel to the bit lines 203 and substantially perpendicular to the source lines 202 of the memory device 101. As shown in FIGS. 1A-1B, one or more shunt lines 117 may extend in both the device region 200 and the peripheral region 300 of the memory device 101.

As shown in FIG. 2A, the shunt lines 117 may extend above the device levels 70 of the memory device 101. Each of the substantially pillar-shaped support members 107 may be located under a shunt line 117. A first end 121 of the conductive core 111 of the support member 107 may be electrically coupled to the doped well region 105 of the substrate 100, and a second end 123 of the conductive core 111 opposite the first end 121 may be electrically coupled to a shunt line 117. A conductive via 119 may extend between the shunt line 117 and the second end 123 of the conductive core 111 of the support member 107. Thus, the shunt lines 117 may be electrically connected to the doped well region 105 of the substrate 100 via the pillar-shaped support members 107. The shunt lines 117 may be used to bias (e.g. apply a pre-determined electric potential to) the doped well region 105, as may be desirable during operation of the memory 101 device.

Figure 22:
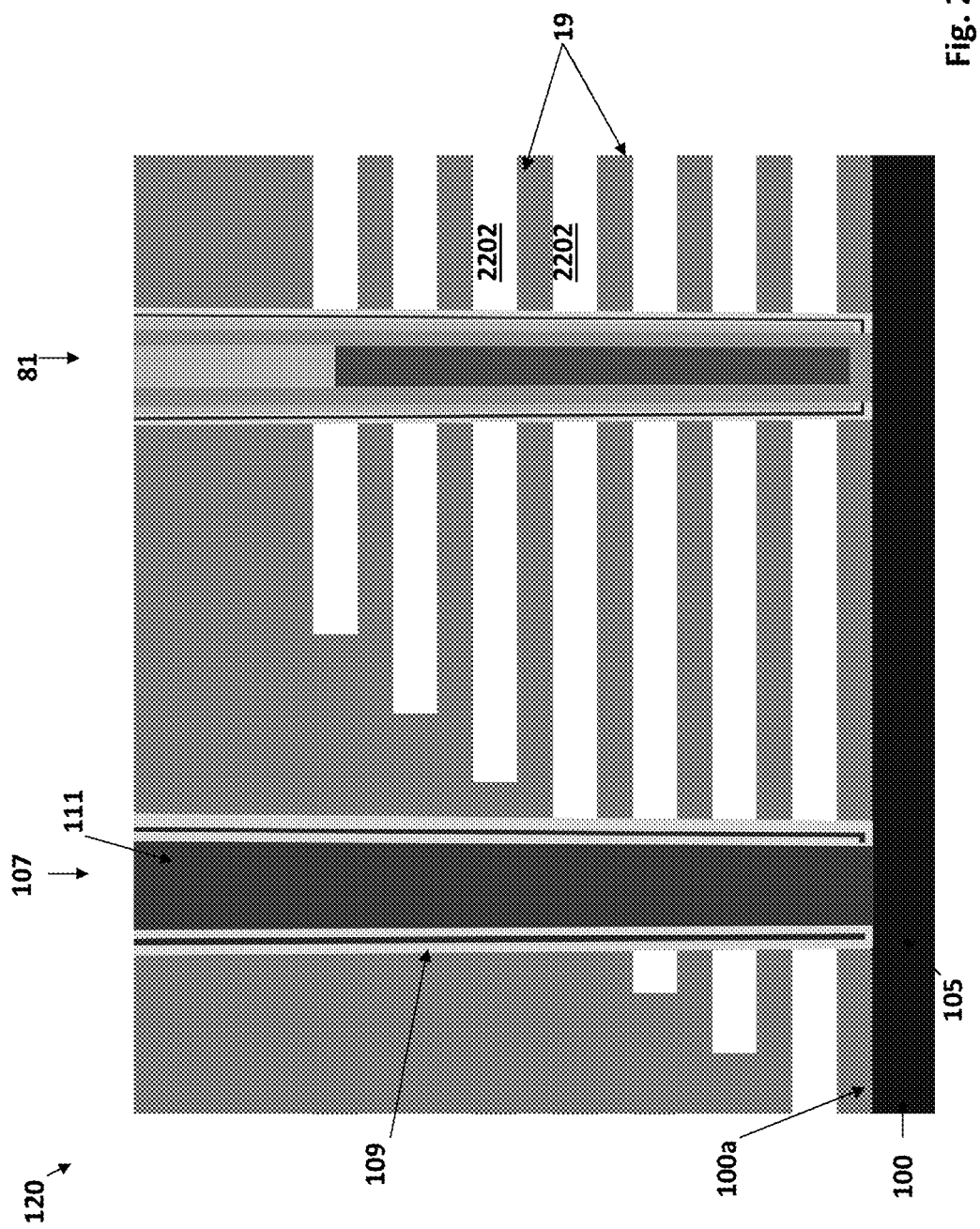
Figure 23:
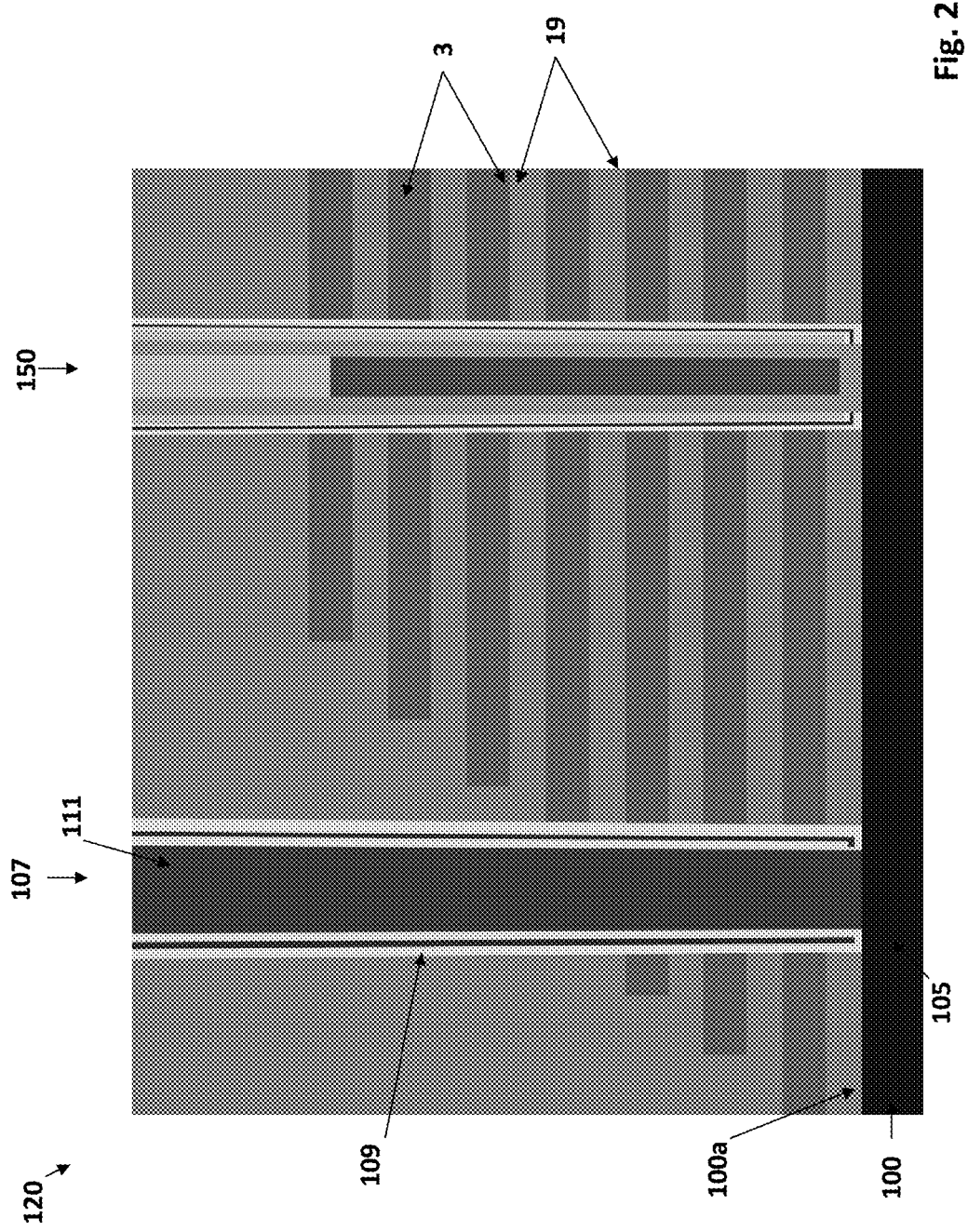

FIGS. 3A-3B are side cross section and top views, respectively, of a substantially pillar-shaped support member 107 that illustrate an electrically insulating outer material 109 surrounding an electrically conductive core material 111. In some embodiments, as described in more detail below with respect to FIGS. 6-40, the plurality of word lines 3 (i.e., control gate electrodes) may be formed by first forming a stack of an alternating plurality of first insulating material layers 19 and second sacrificial material layers 121, as shown in FIGS. 7-21, then removing the plurality of sacrificial layers 121 and filling the resulting openings 182 with a conductive material to form the word lines/control gate electrodes 3, as shown in FIGS. 22-23. This process may be referred to as a gate replacement process. In various embodiments, the substantially pillar-shaped support members 107 may be formed prior to performing a gate replacement process, and the support members 107 may help to support the stack layers (e.g., layers 19, as shown in FIG. 3A) after the sacrificial layers 121 are removed.

FIGS. 4A-4C are side cross sectional (FIGS. 4A and 4C) and top cross sectional (FIGS. 4B and 4D) views of a monolithic three dimensional NAND string 150 according to embodiments. The NAND strings 150 may be located in one or more active memory cell areas 201 of the memory device 101, such as described above with reference to FIGS. 1A-2C.

In some embodiments, the monolithic three dimensional NAND string 150 comprises a semiconductor channel 1 having at least one end portion extending substantially perpendicular to a major surface 100a of a substrate 100, as shown in FIGS. 4A and 4C. "Substantially perpendicular to" (or "substantially parallel to") means within 0-10°. For example, the semiconductor channel 1 may have a pillar shape extending through a plurality of memory device levels 70 (e.g., Level A, Level B, etc. in FIG. 4C) and the entire pillar-shaped semiconductor channel in the memory device levels extends substantially perpendicularly to the major surface 100a of the substrate 100, as shown in FIGS. 4A and 4C. The channels 1 may be electrically connected to a first (e.g., drain) electrode 103 which is schematically illustrated in FIGS. 4A and 4C. The first (e.g., drain) electrode 103 may connect to the top of the channel 1. The bottom of the channel 1 may connect to a second (e.g., source) electrode 202 (see source line 202 in FIG. 2C, not shown in FIGS. 4A and 4C) via a horizontally-extending channel portion 115 which may be located in a doped well region 105 of the substrate 100. The NAND string 150 may further include drain-side and source-side select or access transistors (not shown in FIGS. 4A and 4C for clarity) which may be located above and below the memory levels 70 of the NAND string 150, respectively.

In some embodiments, the semiconductor channel 1 may be a filled feature, as shown in FIGS. 4C and 4D. In some other embodiments, the semiconductor channel 1 may be hollow, for example a hollow cylinder filled with an insulating fill material 2, as shown in FIGS. 4A and 4B. In these embodiments, an insulating fill material 2 may be formed to fill the hollow part surrounded by the semiconductor channel 1.

A memory device 101 may comprise a plurality of NAND strings 150 formed in a stack 120 of material layers over the substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, which may be continuous with the word lines 3 shown in FIGS. 2A-2C, above. The control gate electrodes/word lines 3 may be electrically separated from each other by a plurality of electrically insulating layers 19 forming a stack 120 of alternating control gate electrodes/word lines 3 and insulating layers 19. The control gate electrodes/word lines 3 may comprise a portion having a strip shape extending substantially parallel to the major surface 100a of the substrate 100. The plurality of control gate electrodes/word lines 3 comprise at least a first control gate electrode/word line 3a located in a first device level (e.g., device level A) and a second control gate electrode/word line 3b located in a second device level (e.g., device level B) located over the major surface 100a of the substrate 100 and below the device level A. The material of the word lines/control gates 3 may comprise any one or more suitable conductive or semiconductor control gate material known in the art, such as doped polysilicon, tungsten, tungsten nitride, copper, aluminum, tantalum, titanium, cobalt, titanium nitride or alloys thereof or combination of these materials.

A blocking dielectric 7 may be located adjacent to the control gate(s) 3. For example, a straight blocking dielectric layer 7 may be located only adjacent to an edge (i.e., minor surface) of each control gate 3, as shown in FIGS. 4A and 4C. Alternatively, the blocking dielectric may surround the control gate 3, such as on the top, bottom and side surface of the control gate 3 facing the semiconductor channel 1.

The monolithic three dimensional NAND string may also comprise a charge storage region 9. The charge storage region 9 may comprise one or more continuous layers which extend the entire length of the memory cell portion of the NAND string, as shown in FIGS. 4A and 4C. For example, the charge storage region 9 may comprise an insulating charge trapping material, such as a silicon nitride layer. Alternatively, the charge storage region may comprise a plurality of discrete charge storage regions or segments 9 located between the blocking dielectric and the channel 1. The plurality of discrete charge storage regions 9 may comprise at least a first discrete charge storage region located in the device level A and a second discrete charge storage region located in the device level B. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal particles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

Various embodiments relate to methods of making a memory device that include a support member 107 having an electrically conductive material 111 surrounded by an electrically insulating material 109, such as the device 101 described above with reference to FIGS. 1A-4D. FIGS. 5-23 illustrate a method of making a memory device 101 according to one embodiment. FIGS. 5-23 are side cross sectional views taken along line E-E' in FIG. 1B. In this embodiment, a substantially pillar shaped support member 107 is formed in a word line connection region 302 while at least one NAND string 150 is formed in an active memory cell area 201 adjacent to the word line connection region 302. However, it will be understood that a similar method may be used to form a support member 107 in the active memory cell area 201.

Referring to FIG. 5, the method includes forming a stack 120 of alternating first material layers 19 and second material layers 121 over a major surface 100a of substrate 100. The second material is different from the first material. The layers 19, 121 may be formed by a suitable deposition method, such as sputtering, CVD, PECVD, MBE, ALD, etc. The layers 19, 121 may be 6 to 100 nm thick.

In one embodiment, the first material layers 19 comprise an electrically insulating material, such as an oxide (e.g., silicon oxide, silicon oxynitride, a high-k dielectric, etc.). The second material layers 121 may comprise a sacrificial material, such as an insulating material that is different from the material of the first layers 19. For example, layers 19 may comprise silicon oxide (e.g., formed using a tetraethyl orthosilicate (TEOS) source) and layers 121 may comprise silicon nitride forming an ONON stack 120. Alternatively, layers 19 may comprise silicon oxide and layers 121 may comprise polysilicon forming an OPOP stack 120.

As shown in FIG. 5, the second material layers 121 may be formed having a stepped configuration within the word line connection region 302. In other words, at least a portion of the second material layers 121 may terminate in the word line connection region 302, and the underlying second material layer(s) 121 may extend laterally beyond the terminated layer(s) into the word line connection region 302 to form a stepped configuration as shown in FIG. 5.

The formation of layers 19, 121 may be followed by etching the stack 120 to form at least one memory opening 81 and at least one support pillar opening 501 in the stack 120. The at least one memory opening 81 and the at least one support pillar opening 501 may be formed by photolithography and etching as follows. First, a mask 503 may be formed over the stack 120 and patterned to form at least one first opening 505 corresponding to a future location of a memory opening 81 and at least one second opening 507 corresponding to the future location of a support pillar opening 501, as shown in FIG. 5. The at least one second opening 507 may have a large width dimension (e.g., diameter) than the width dimension of the at least one first opening 505. The mask 503 may comprise any suitable mask layer, such as photoresist or a hard mask material, such as amorphous carbon (e.g., a so-called advance patterning film ("APF™")), silicon nitride, metal, etc., and may be patterned using photolithography. Then, the stack 120 may be etched (e.g., using reactive ion etching (RIE)) to form the at least one support pillar opening 501 and the at least one memory opening 81 in the stack as shown in FIG. 6. In the embodiment of FIG. 6, the etching may be stopped at the substrate 100. In particular, the etching may expose a doped well region 105 (e.g., p-well region) of the substrate 100 at the bottom of the at least one support pillar opening 501 and the at least one memory opening 81. Alternatively, an etch stop layer may be formed over the substrate and the etching may be stopped on the etch stop layer. Following the etching to form the openings 501, 81, the mask 503 may be removed, such as by ashing, as shown in FIG. 7.

The memory opening 81 may include a sidewall 701 defined by the exposed surfaces of the layers 19, 121 of the stack 120 and a bottom surface 703, which in this embodiment is defined by the exposed surface of the substrate 100. The support pillar opening 501 may also include a sidewall 705 defined by the exposed surfaces of the layers 19, 121 of the stack 120 and a bottom surface 707, which may be defined by the exposed surface (e.g., doped well region 105) of the substrate 100.

Figure 8:
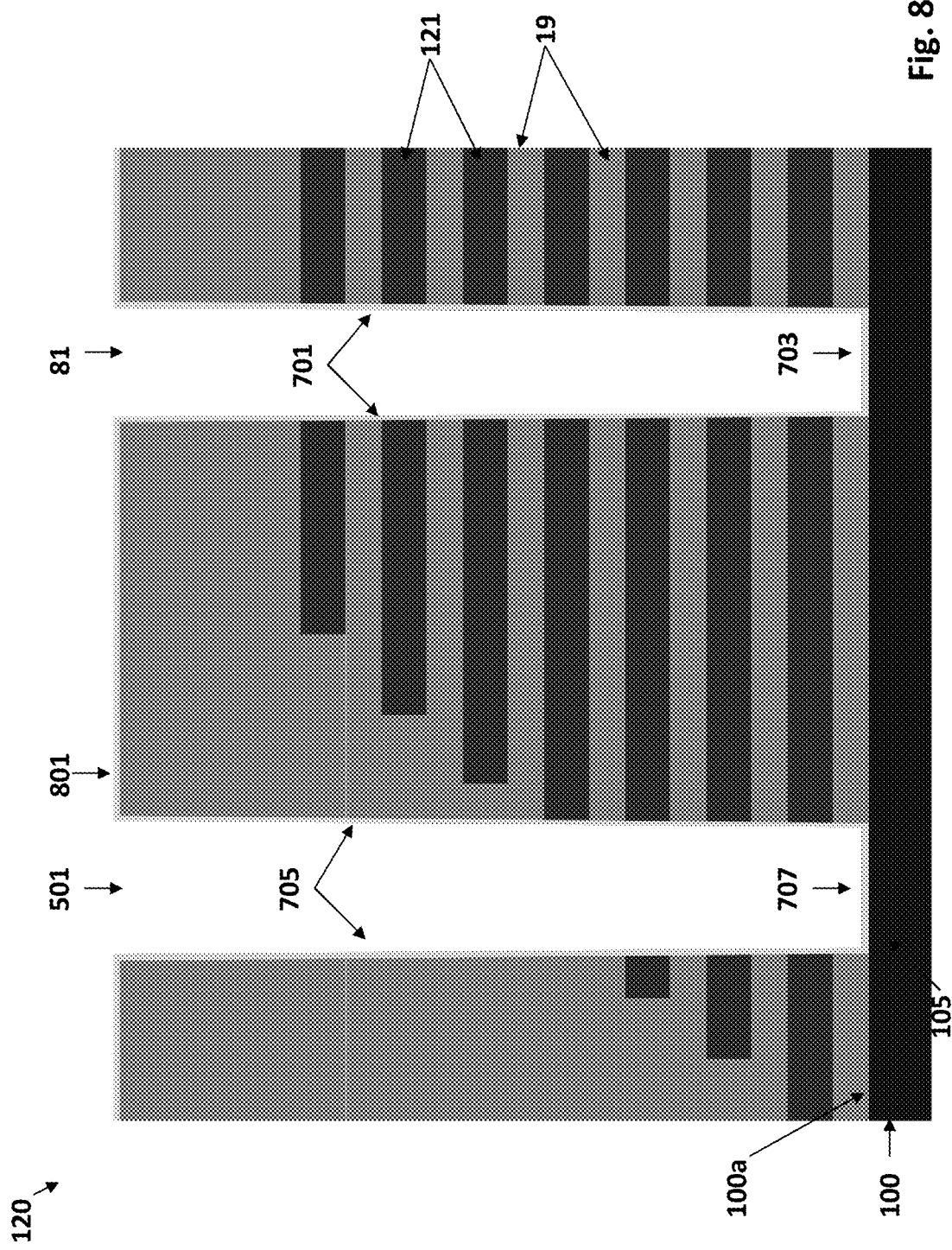

Referring to FIG. 8, an insulating material layer 801 may be formed over the stack 120, including over the sidewall 701 and bottom surface 703 of the at least one memory opening 81 and over the sidewall 705 and bottom surface 707 of the at least one support pillar opening 501. The insulating material layer 801 may comprise an oxide material or a nitride material (e.g., silicon oxide, silicon nitride, silicon oxynitride, etc.) deposited by a suitable technique (e.g., CVD), and may form at least a portion of the blocking dielectric 7 of a future NAND string 150 formed in the memory opening 81, as shown for example in FIGS. 4A-4C, above.

Figure 9:
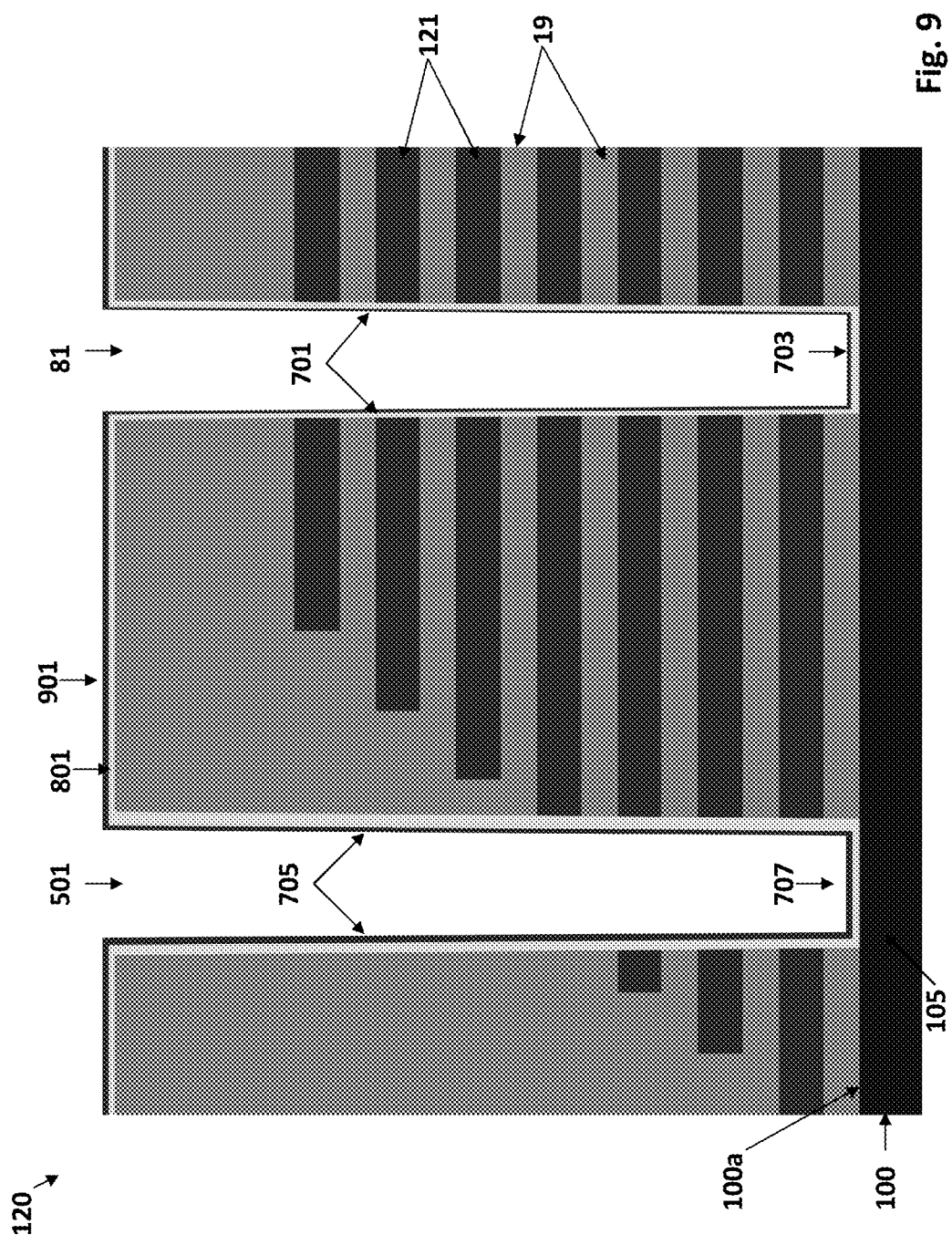

Referring to FIG. 9, a layer 901 of charge storage material may be formed over the insulating material layer 801, including on the sidewall 701 and bottom surface 703 of the at least one memory opening 81 and on the sidewall 705 and bottom surface 707 of the at least one support pillar opening 501. The layer 901 may comprise a charge trap material (e.g., silicon nitride) deposited by a suitable technique (e.g., CVD), and may form at least a portion of the charge storage material 9 of a future NAND string 150 formed in the memory opening 81, as shown for example in FIGS. 4A-4C, above.

Figure 10:
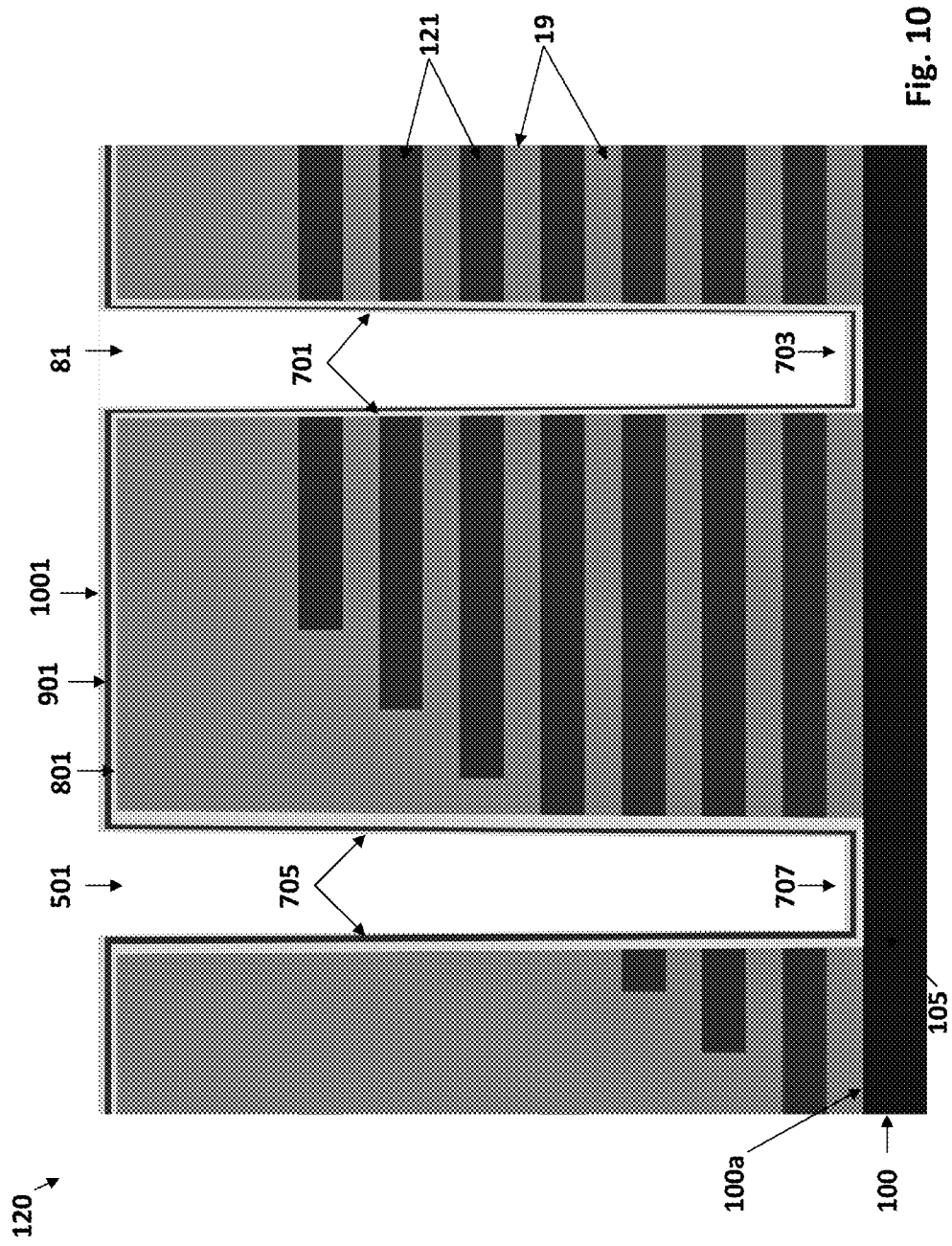

Referring to FIG. 10, a layer 1001 of insulating material may be formed over the layer 901 of charge storage material, including on the sidewall 701 and bottom surface 703 of the at least one memory opening 81 and on the sidewall 705 and bottom surface 707 of the at least one support pillar opening 501. The layer 1001 may comprise an oxide material or a nitride material (e.g., silicon oxide, silicon nitride, silicon oxynitride, etc.) deposited by a suitable technique (e.g., CVD), and may form at least a portion of the tunnel dielectric 11 of a future NAND string 150 formed in the memory opening 81, as shown for example in FIGS. 4A-4C, above.

Figure 11:
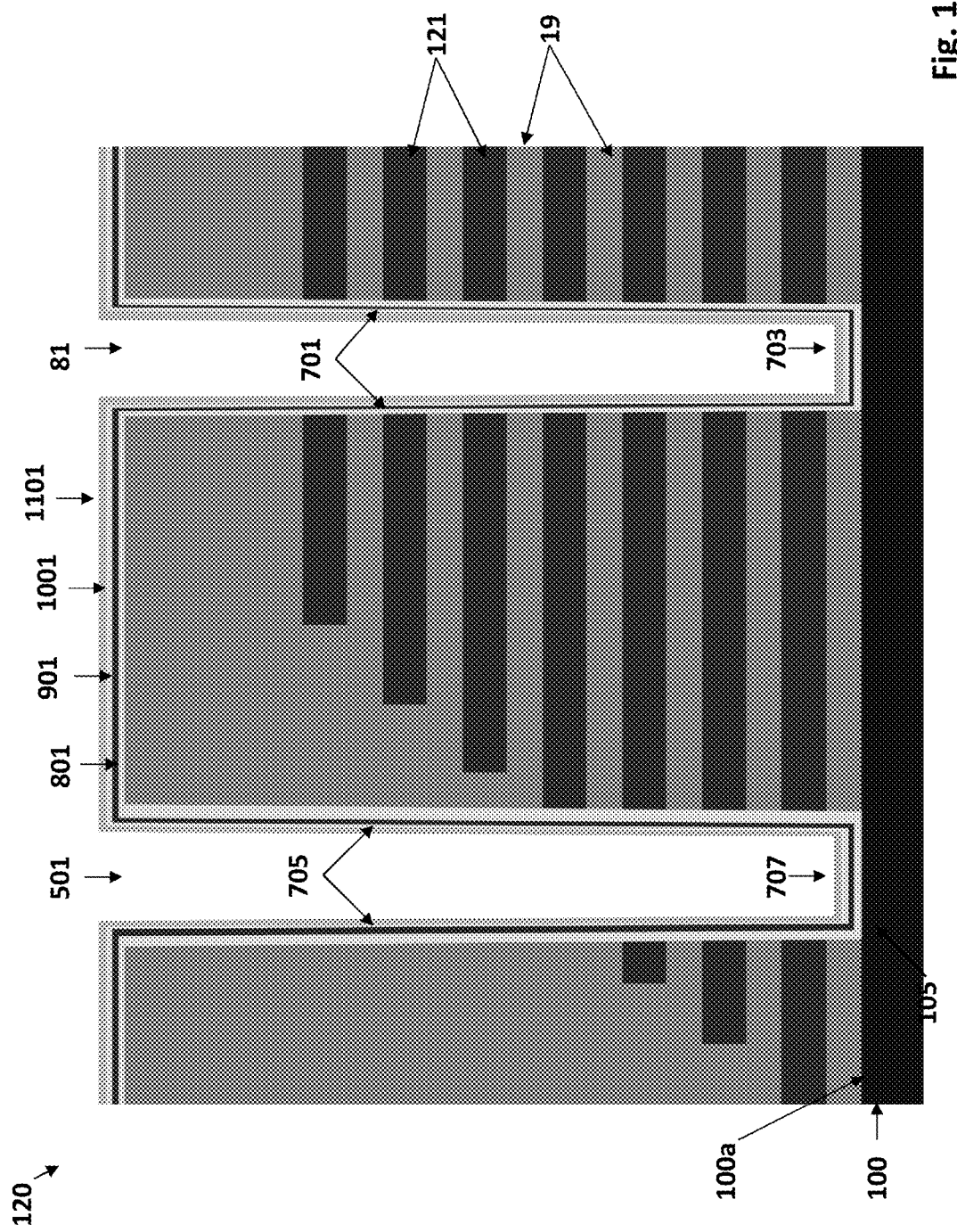

Referring to FIG. 11, a semiconductor cover layer 1101 (e.g., a polysilicon or amorphous silicon layer) may be formed over the layer 1001 of insulating material, including on the sidewall 701 and bottom surface 703 of the at least one memory opening 81 and on the sidewall 705 and bottom surface 707 of the at least one support pillar opening 501. The semiconductor cover layer 1101 may be formed using a suitable technique (e.g., CVD), and may form at least a portion of the semiconductor channel 1 of a future NAND string 150 formed in the memory opening 81, as shown for example in FIGS. 4A-4C, above.

Figure 12:
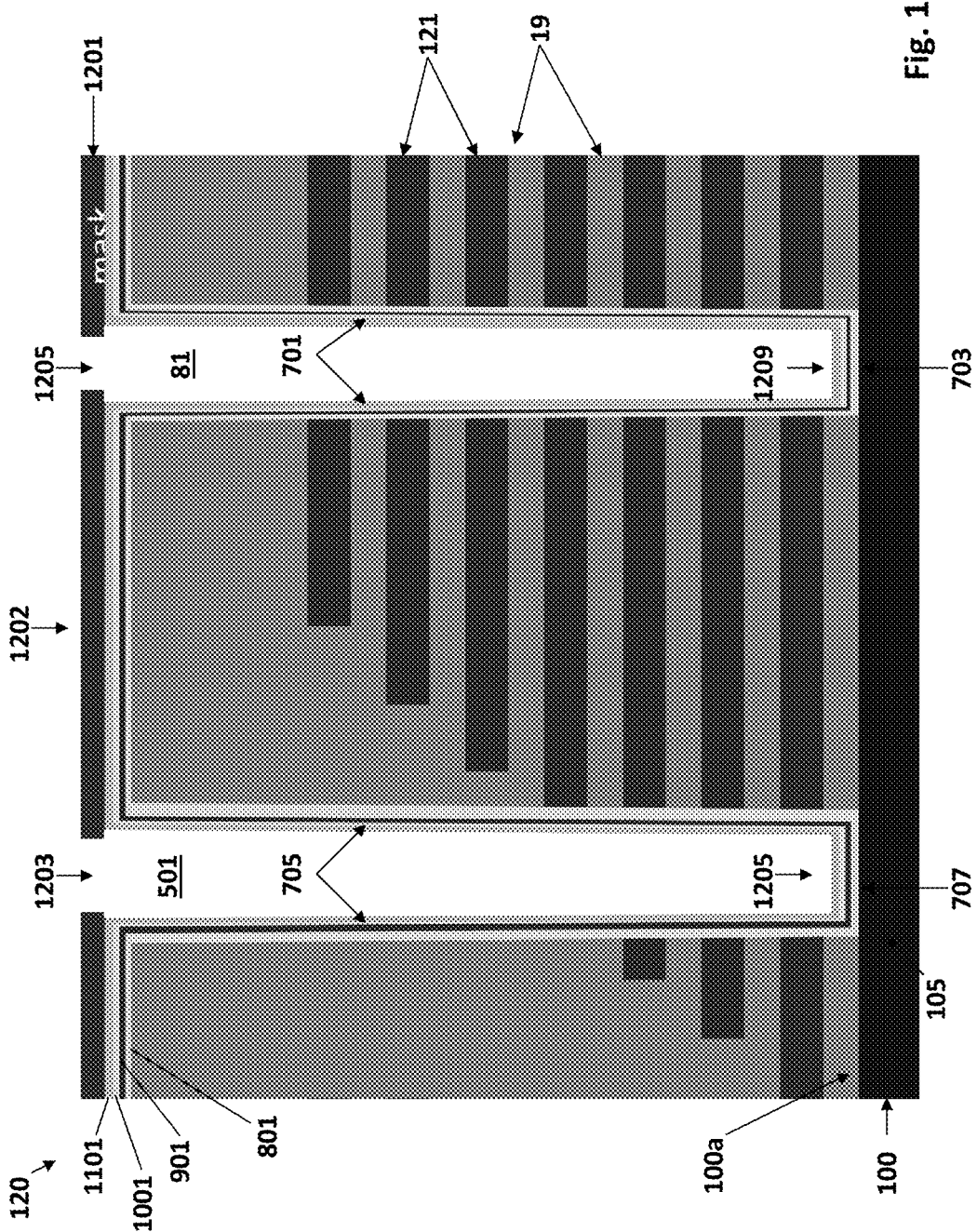

Referring to FIG. 12, a second mask layer 1201 may be formed over the semiconductor cover layer 1101 on the top surface 1202 of the stack 120. The second mask layer 1201 may comprise any suitable mask layer, such as photoresist or a hard mask material, such as amorphous carbon, silicon nitride, metal, etc., and may be patterned using photolithography. The second mask layer 1201 may include a first opening 1203 that exposes a portion 1205 of the semiconductor cover layer 1101 in the bottom surface 707 of the support pillar opening 501. The second mask layer 1201 may cover the portions of layers 1101, 1001, 901 and 801 that extend over the sidewall 705 of the support pillar opening 501, as shown in FIG. 12. Similarly, the second mask layer 1201 may include a second opening 1207 that exposes a portion 1209 of the semiconductor cover layer 1101 in the bottom surface 703 of the memory opening 81, while the second mask layer 1201 may cover the portions of layers 1101, 1001, 901 and 801 that extend over the sidewall 701 of the memory opening 81.

Figure 13:
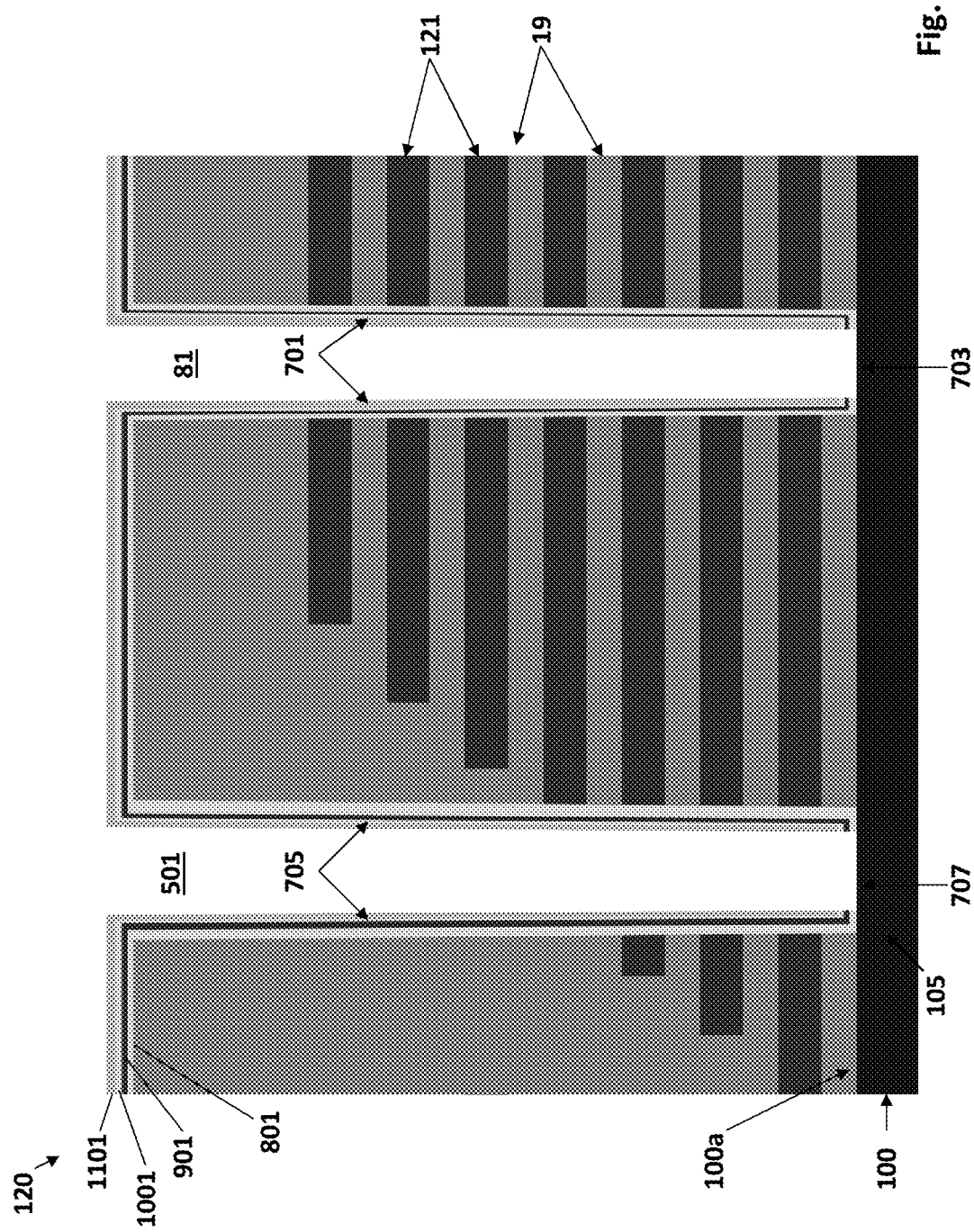

Referring to FIG. 13, the stack 120 may be etched through the second mask layer 1201 (e.g., using a directional etch, such as a reactive ion etching (RIE) process) to remove portions of layers 1101, 1001, 901 and 801 exposed by the mask 1201 from the bottom surface 707 of the support pillar opening 501 and from the bottom surface 703 of the memory opening 81. The semiconductor cover layer 1101 may protect layers 1001, 901 and 801 extending over the sidewalls 705, 701 of the support pillar opening 501 and the memory opening 81 from damage during the etching. Following the etching, the substrate 100 (e.g., doped well region 105) may be exposed on the bottom surfaces 707, 703 of the support pillar opening 501 and the memory opening 81, respectively. The second mask layer 1201 may then be removed (e.g., via ashing), as shown in FIG. 13. Alternatively, the second mask layer 1201 may be omitted, and layers 1101, 1001, 901 and 801 may be removed from bottom surfaces 703, 707 of the openings 81, 501 and from the top surfaces of the stack 120 by directional etching which does not remove the portions of the layers 1101, 1001, 901 and 801 from the sidewalls of the openings 81, 501.

Figure 14:
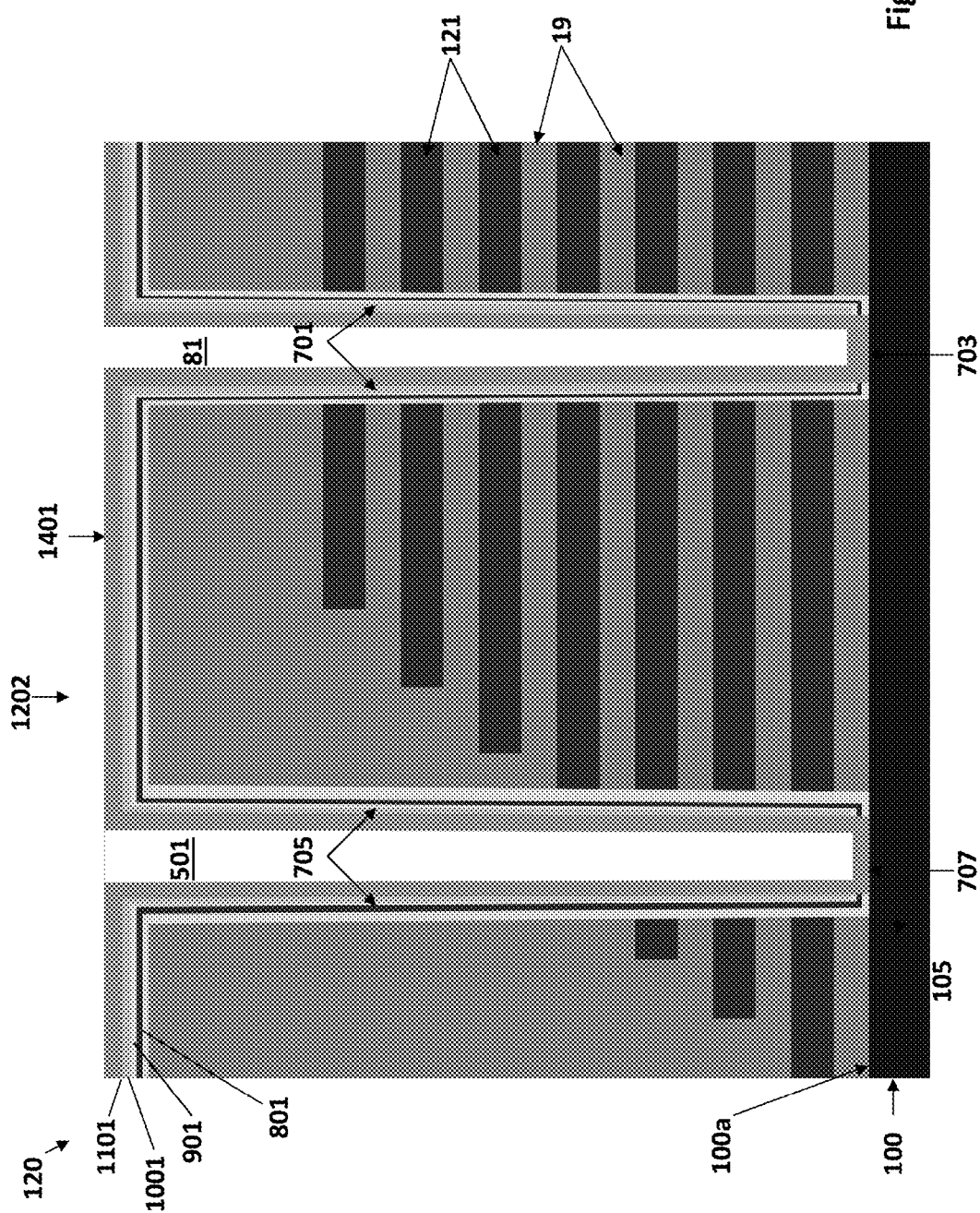

Referring to FIG. 14, a semiconductor material channel layer 1401 (e.g. a polysilicon or amorphous silicon layer) may be formed over the stack 120, including over the semiconductor cover layer 1001 on the top surface 1202 of the stack 120 and on the sidewalls 705, 701 of the support pillar opening 501 and the memory opening 81, respectively. The semiconductor material channel layer 1401 may be formed in contact with the substrate 100 (e.g., the doped well region 105 of the substrate 100) on the bottom surfaces 707, 703 of the support pillar opening 501 and the memory opening 81, respectively. The channel layer 1401 may be deposited using a suitable process (e.g., CVD). Together layers 1401 and 1001 may form the vertically oriented semiconductor channel 1 of the NAND string 150 within the memory opening 81, as shown for example in FIGS. 4A-4C, above.

Figure 15:
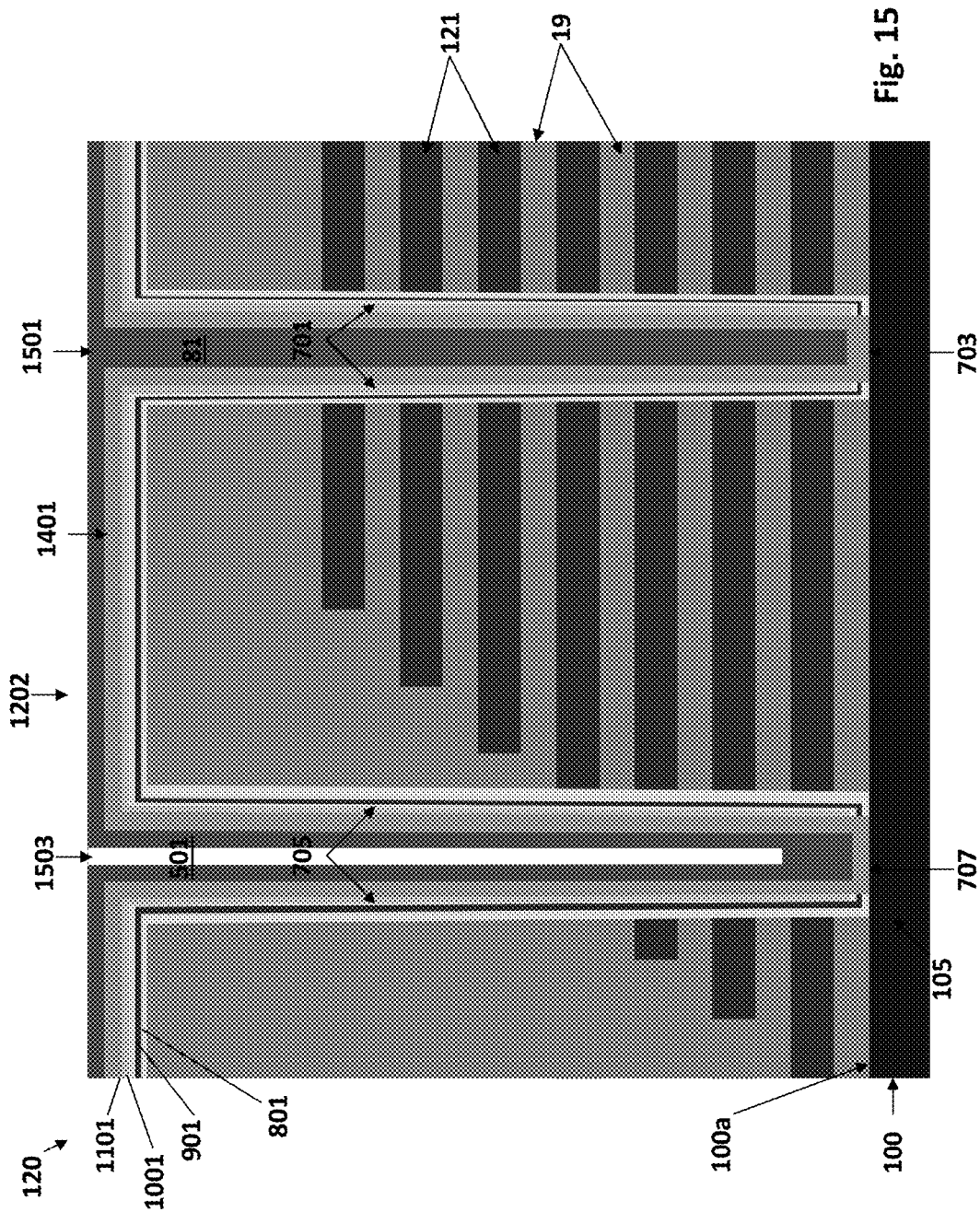

Referring to FIG. 15, a layer of core insulator material 1501 (e.g., silicon oxide) may be formed over the stack 120, including over the top surface 1202 of the stack 120 and within the support pillar opening 501 and the memory opening 81. As shown in FIG. 15, in embodiments, the core insulator material 1501 may completely fill the memory opening 81, and may provide the insulating fill material 2 of the NAND string 150, such as shown in FIGS. 4A and 4B, above. The core insulator material 1501 may not completely fill the support pillar opening 501 (which may have a larger width dimension than the memory opening 81). The layer of core insulator material 1501 may be formed over the channel layer 1401 on the sidewall 705 and the bottom surface 707 of the support pillar opening 501, and the support pillar opening 501 may include a hollow core 1503 interior of the core insulator material 1501 over at least a portion of the support pillar opening 501, as shown in FIG. 15.

Figure 16:
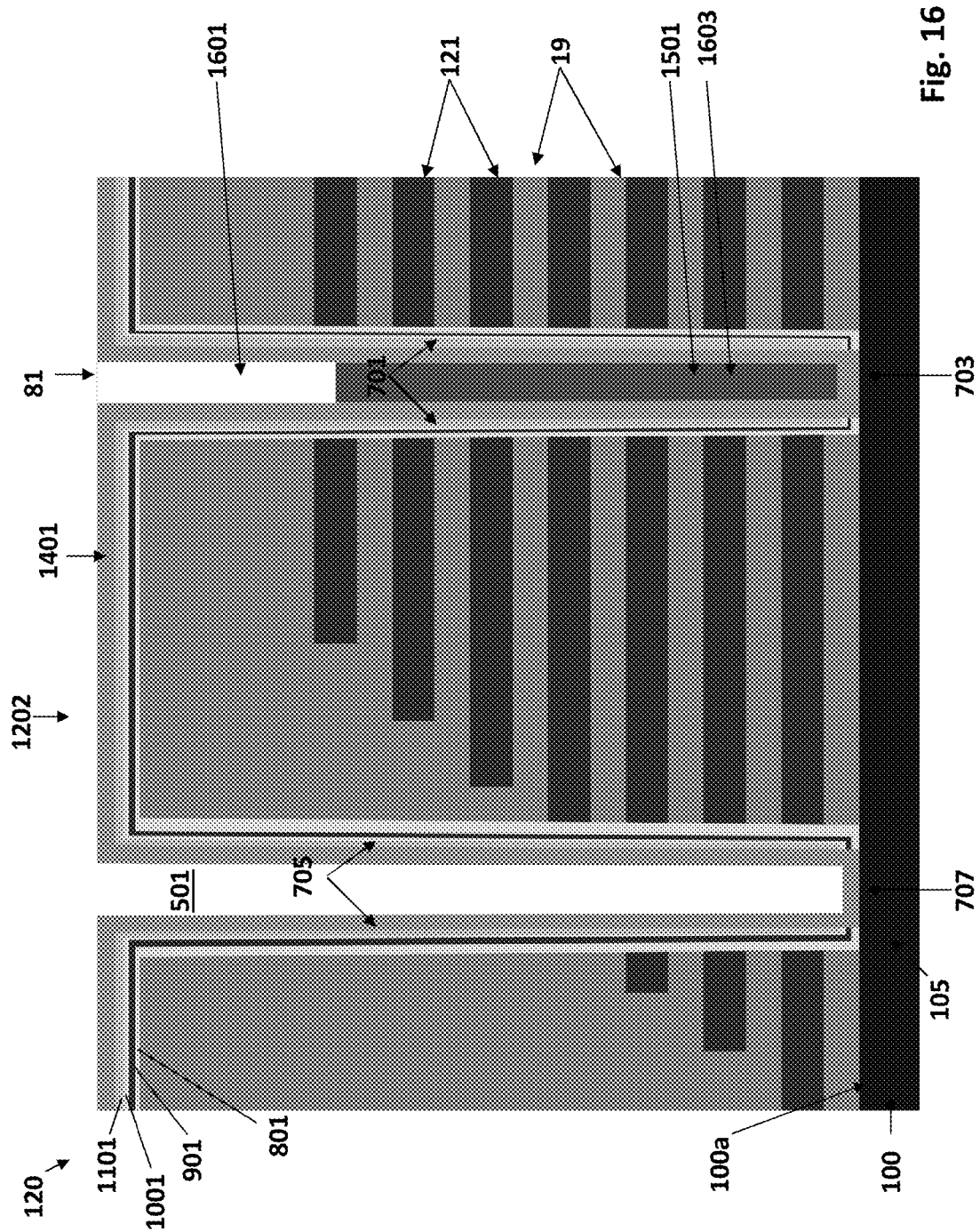

Referring to FIG. 16, the stack 120 may be etched (e.g., using an isotropic etching process, such as a remote plasma assisted dry etch process, e.g., a SiConi™ etching process) to remove at least a portion of the core insulator material 1501 (e.g., silicon oxide). In particular, the core insulator material 1501 may be completely removed from the top surface 1202 of the stack 120 and from the sidewall 705 of the support pillar opening 501 to expose the semiconductor channel material 1401. Because the core insulator material 1501 completely fills the memory opening 81 (see FIG. 15) the etching may remove the material 1501 from a top portion 1601 of the memory opening 81 while a bottom portion 1603 of the memory opening 81 may remain filled with the core insulator material 1501, as shown in FIG. 16.

Figure 17:
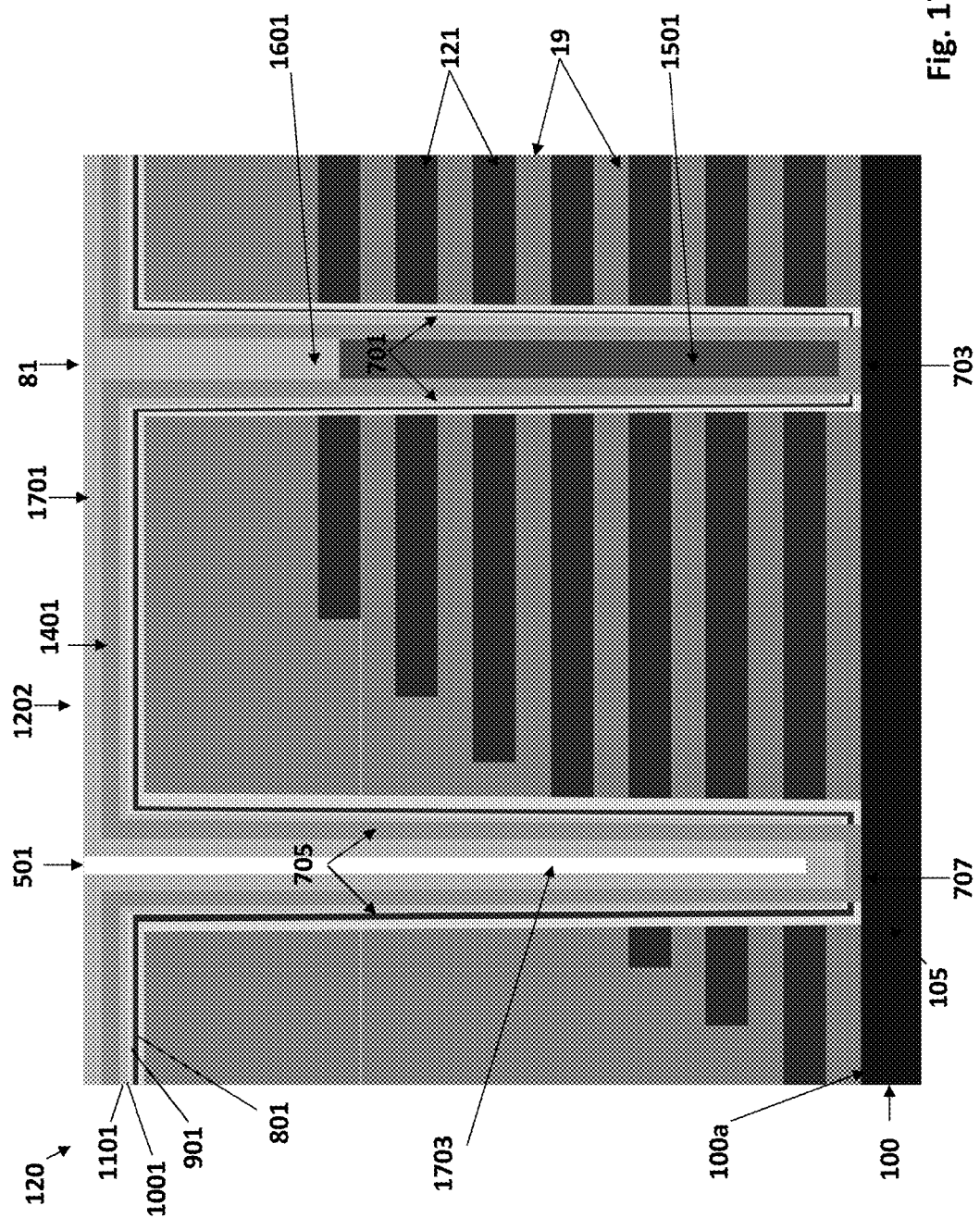

Referring to FIG. 17, a cap layer 1701 comprising a semiconductor material (e.g., polysilicon or amorphous silicon) may be formed over the stack 120, including over the top surface 1202 of the stack 120 and within the support pillar opening 501 and the memory opening 81. As shown in FIG. 17, in embodiments, the cap layer 1701 may completely fill the top portion 1601 of the memory opening 81 above the core insulator material 1501. The cap layer 1701 may be formed over the channel layer 1401 on the sidewall 705 and bottom surface 707 of the support pillar opening 501 and may not completely fill the support pillar opening 501, as shown in FIG. 17. The support pillar opening 501 may include a hollow core 1703 interior of the cap layer 1701 over at least a portion of the support pillar opening 501.

Figure 18:
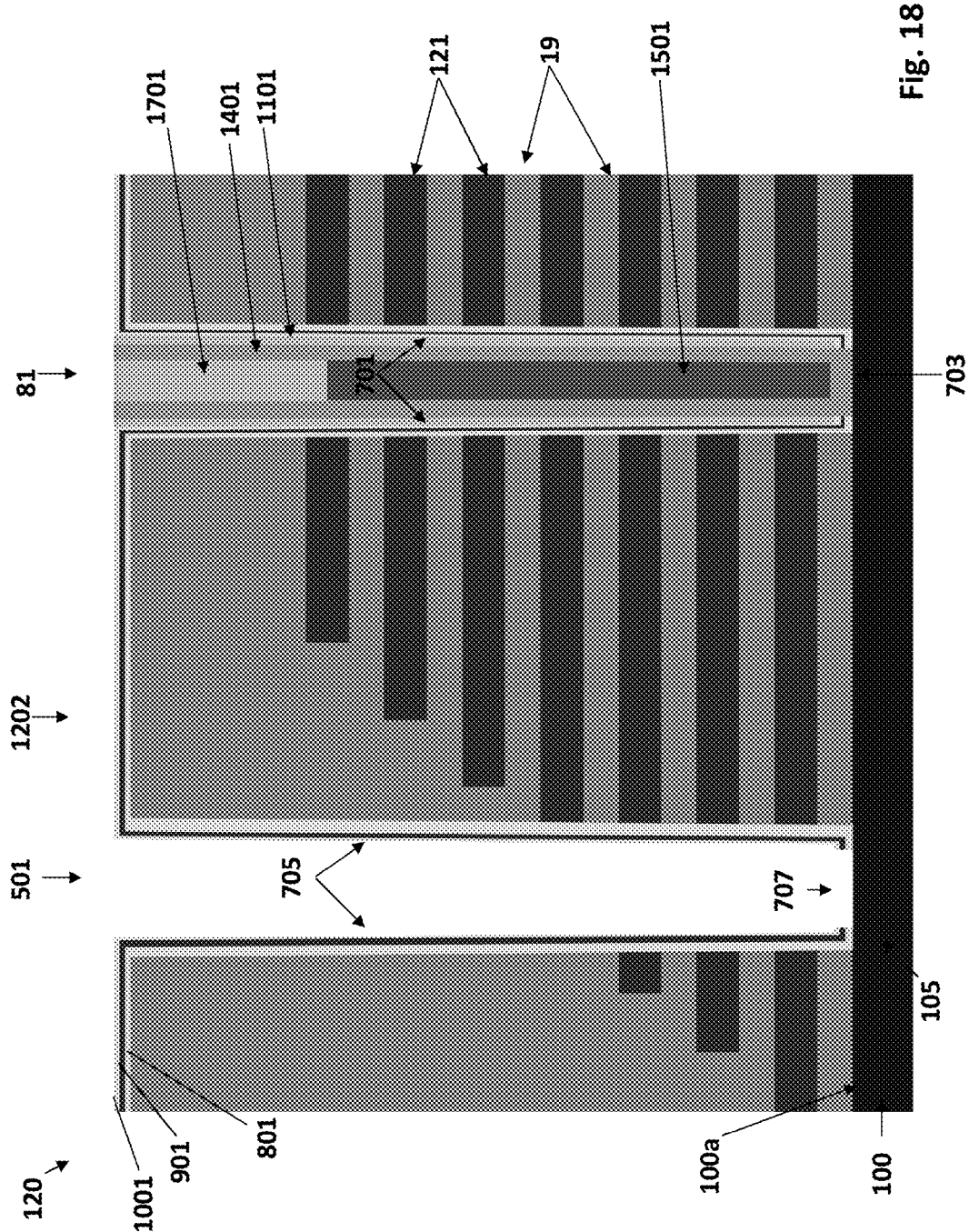

Referring to FIG. 18, the stack 120 may be etched using one or more isotropic etching processes (e.g., chemical dry etch or wet etching scheme) to substantially completely remove the cap layer 1701, the semiconductor material channel layer 1401 and the semiconductor cover layer 1101 from the top surface 1202 of the stack 120 and from the sidewall 705 and the bottom surface 707 of the support pillar opening 501. The etching may expose the layer 1001 of insulating material (e.g., tunnel dielectric) over the sidewall 705 of the support pillar opening 501 and the doped well region 105 of the substrate 100 on the bottom surface 707 of the support pillar opening 501.

An optional implantation process to implant the same conductivity type dopants as that of the well region 105 (e.g., a p+ implantation) may be performed through the support pillar opening 501 to provide a lower contact resistance region (e.g., a heavily doped p+ region) within the doped well region 105. The memory opening 81 may be covered by a mask during this implantation step.

The etching may recess the cap layer 1701 above the memory opening 81 as shown in FIG. 18, but in embodiments the etching may not remove a significant amount or any of the cap layer 1701, the semiconductor material channel layer 1401 and the semiconductor cover layer 1101 from within the memory opening 81. The cap layer 1701 may be doped with an opposite conductivity type dopant (e.g., n-type) from the conductivity type (e.g., p-type) of the well region and the semiconductor channel to form the drain region 116 after the recessing step. Alternatively, the opposite conductivity type dopant (e.g., n-type dopant) may be implanted into recessed cap layer 1701 while the support pillar opening 501 is masked.

Figure 19:
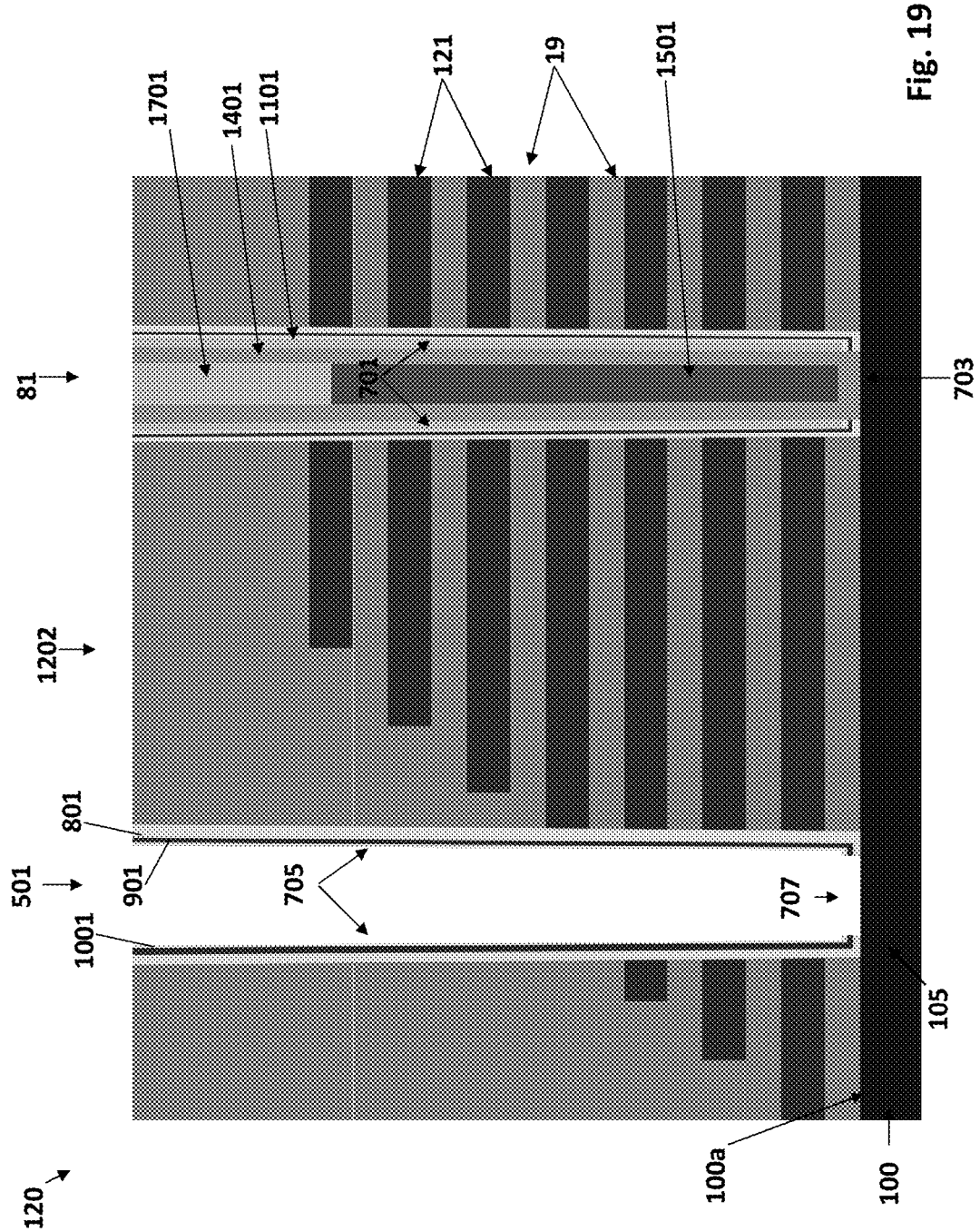

Referring to FIG. 19, an etch back process (e.g., an anisotropic etching process) may be used to remove layers 1001, 901 and 801 from the top surface 1202 of the stack 120. In an alternative embodiment, if the mask 1201 in FIG. 12 is omitted, then layers 1001, 901 and 801 are already removed from the top surface 1202 of the stack 120 during the etching step in FIG. 13 and the etch back process of FIG. 19 may be omitted.

Figure 20:
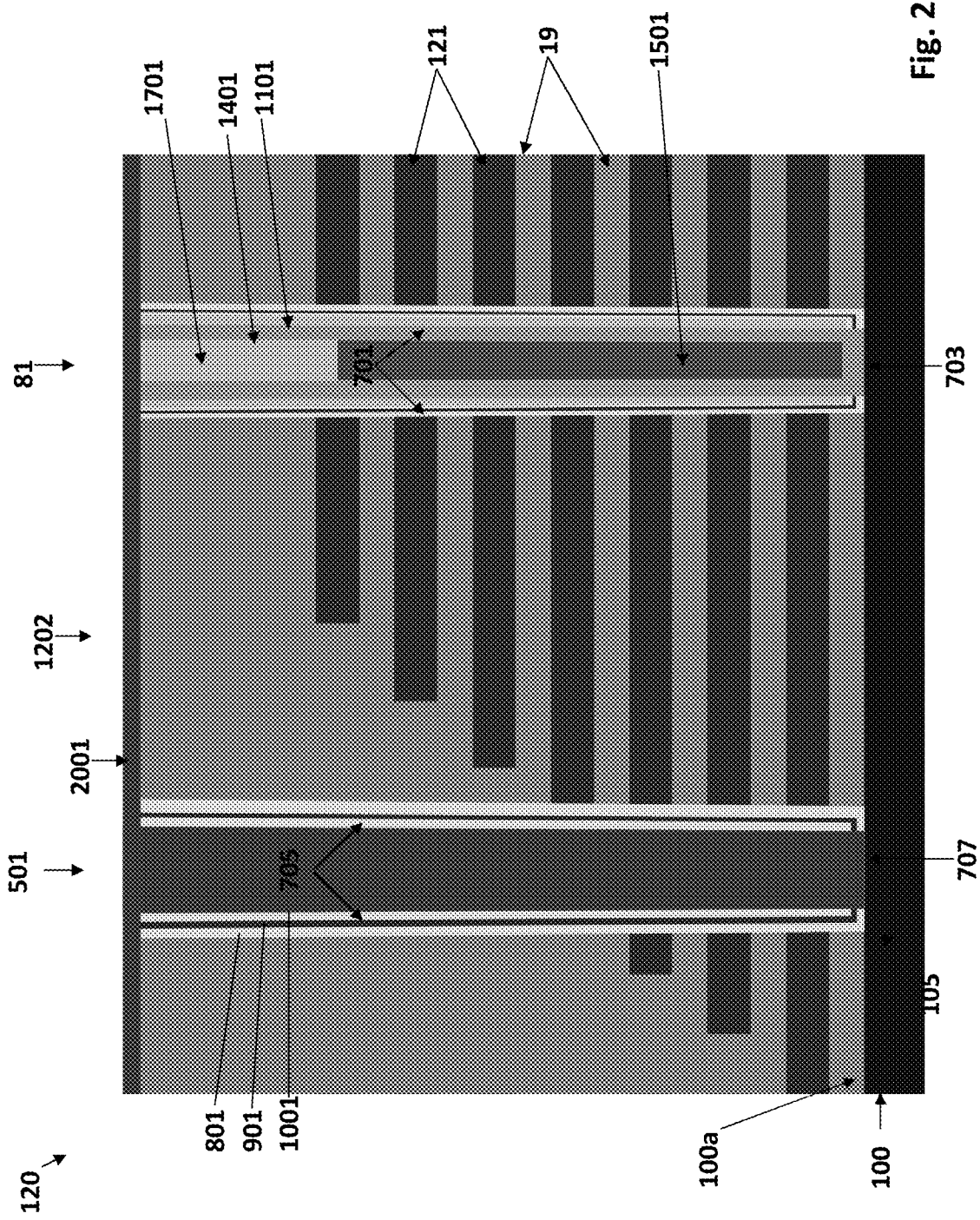

Referring to FIG. 20, an electrically conductive material 2001 may be formed over the stack 120 including over the top surface 1202 of the stack 120 and completely filling the support pillar opening 501. The electrically conductive material 2001 may be formed in electrical contact with the doped well region 105 of the substrate 100 at the bottom surface 707 of the support pillar opening 501. Layers 1001, 901 and 801 may completely surround the electrically conductive material 2001 on the sidewall 705 of the support pillar opening 501. The electrically conductive material 2001 may comprise any suitable conductive material, such as a metal material or doped semiconductor material. In one embodiment, the electrically conductive material comprises polysilicon which may be doped with a suitable dopant material (e.g., boron).

Figure 21:
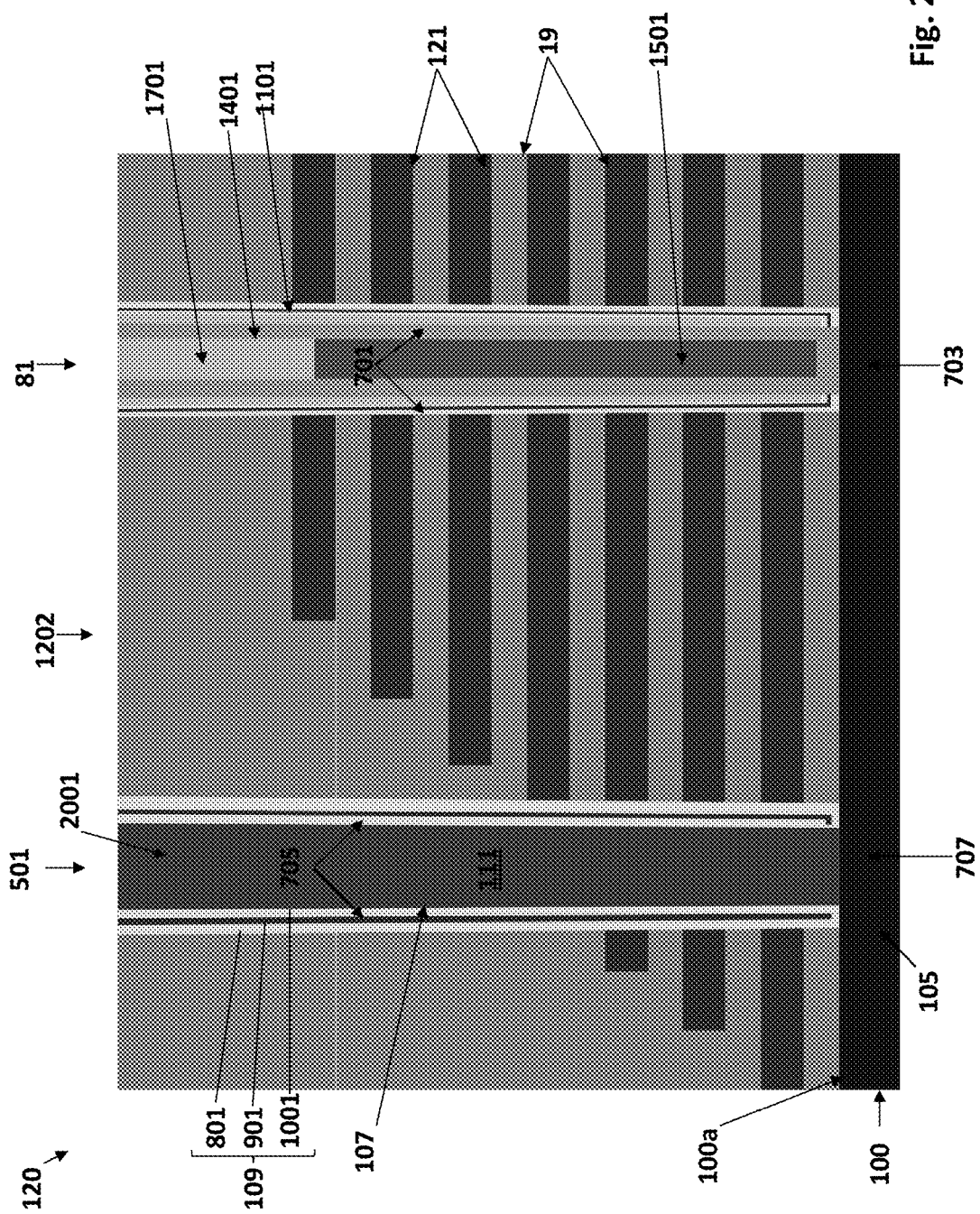

Referring to FIG. 21, an etch back process may remove the conductive material 2001 from the top surface 1202 of the stack 120. Thus, a substantially-pillar shaped support member 107 may be formed in the support pillar opening 501, where the conductive material 2001 may form a conductive core material 111 contacting the doped well region 105 of the substrate, and layers 1001, 901 and 801 may comprise an insulating outer material 109 surrounding the conductive core material 111.

FIGS. 22 and 23 schematically illustrate a gate replacement process for forming conductive word lines/control gates 3 for the NAND strings 150. The gate replacement process may be performed through a back side opening formed through the layers 19, 121 of the stack 120. The back side opening may comprise a slit trench 84 within which a source line 202 may later be formed, such as shown in FIGS. 1B and 2C. As shown in FIG. 1B, the slit trenches 84 may extend generally parallel to line E-E' (i.e., along planes parallel to the cross-section view of FIG. 22 and located behind and/or in front of the page).

Referring to FIG. 22, at least a portion of the second material layers 121 may be removed through the back side opening/slit trench 84 to form back side recesses 2202 between the first material layers 19. Layers 121 may be removed by selective etching, such as a silicon nitride selective etching (e.g., a hot phosphoric acid wet etch) which removes silicon nitride layers 121 but does not remove the silicon oxide material of layers 19. As discussed above, the support member 107 may provides mechanical support for the vertically separated first material layers 19 of the stack 120 after the second material layers 121 are removed.

Referring to FIG. 23, word lines/control gate electrodes 3 may be formed in the back side recesses 2202 through the back side opening 84. Each of the word lines/control gate electrodes 3 may extend adjacent to the NAND string 150 within a respective device level 70 (e.g., Level A, Level B, etc. as shown in FIGS. 4A and 4C) over the major surface 100a of the substrate 100. Each of the word lines/control gate electrodes 3 may comprise one or more electrically conductive metal materials, including one or more metals or metal alloys, including metal nitrides and metal silicides. In one embodiment, the word lines/control gate electrodes 3 may be formed by depositing a metal nitride liner material (e.g., tungsten nitride (WN) or titanium nitride (TiN) liner, not shown in FIG. 23) over the back side recesses 2202, followed by depositing a metal (e.g., tungsten) over the metal nitride liner material to fill the back side recesses 2202. Layers 1001, 901 and 801 over the sidewall 705 of the support pillar opening 501 may insulate the conductive core material 111 of the support member 107 from the word lines/control gate electrodes 3.

In some embodiments, a blocking dielectric 7 (see FIGS. 4A-4D) may be formed through the back side opening 84 within the back side recesses 2202, and the word lines/control gate electrodes 3 may be formed through the back side opening 84 and over the blocking dielectric 7 within the back side recesses 2202. The blocking dielectric 7 may include, for example, a stack of two or more insulating layers, such as a silicon oxide layer and a metal oxide layer (e.g., aluminum oxide or hafnium oxide).

Figure 24:
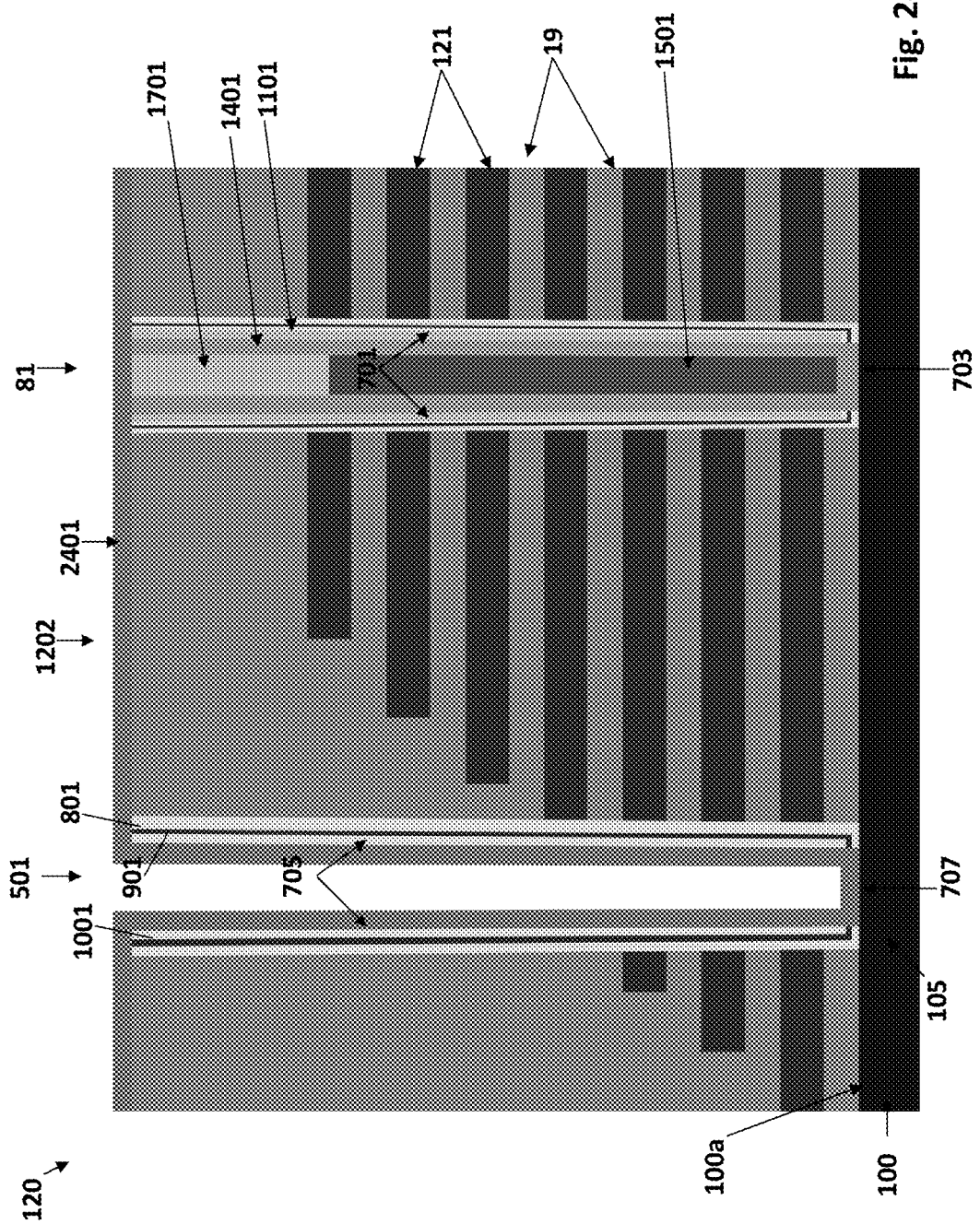
FIGS. 24-27 are side cross sectional views illustrating steps in another embodiment method of making the device illustrated in FIGS. 1A-4D along line E-E' in FIG. 1B.

Another embodiment method of making a memory device having a support member 107 is shown in FIGS. 24-27. FIG. 24 corresponds to FIG. 19 described above, and shows the stack 120 after removal of the cap layer 1701, the semiconductor material channel layer 1401 and the semiconductor cover layer 1101 from the top surface 1202 of the stack 120 and from the sidewall 705 and the bottom surface 707 of the support pillar opening 501 (see FIG. 18), and the removal of layers 1001, 901 and 801 from the top surface 1202 of the stack 120 (see FIG. 19).

In FIG. 24, a spacer insulator layer 2401 may be formed over the stack 120, including over the top surface 1202 of the stack 120 and on the sidewall 705 and bottom surface 707 of the support pillar opening 501. The spacer insulator layer 2401 may be formed in order to provide additional electrical insulation (e.g. in addition to the insulation provide by layers 1001, 901 and 801) between the conductive core material 111 of the support member 107 and the conductive word lines 3. The spacer insulator layer 2401 may comprise any suitable insulating material, such as silicon oxide.

Figure 25:
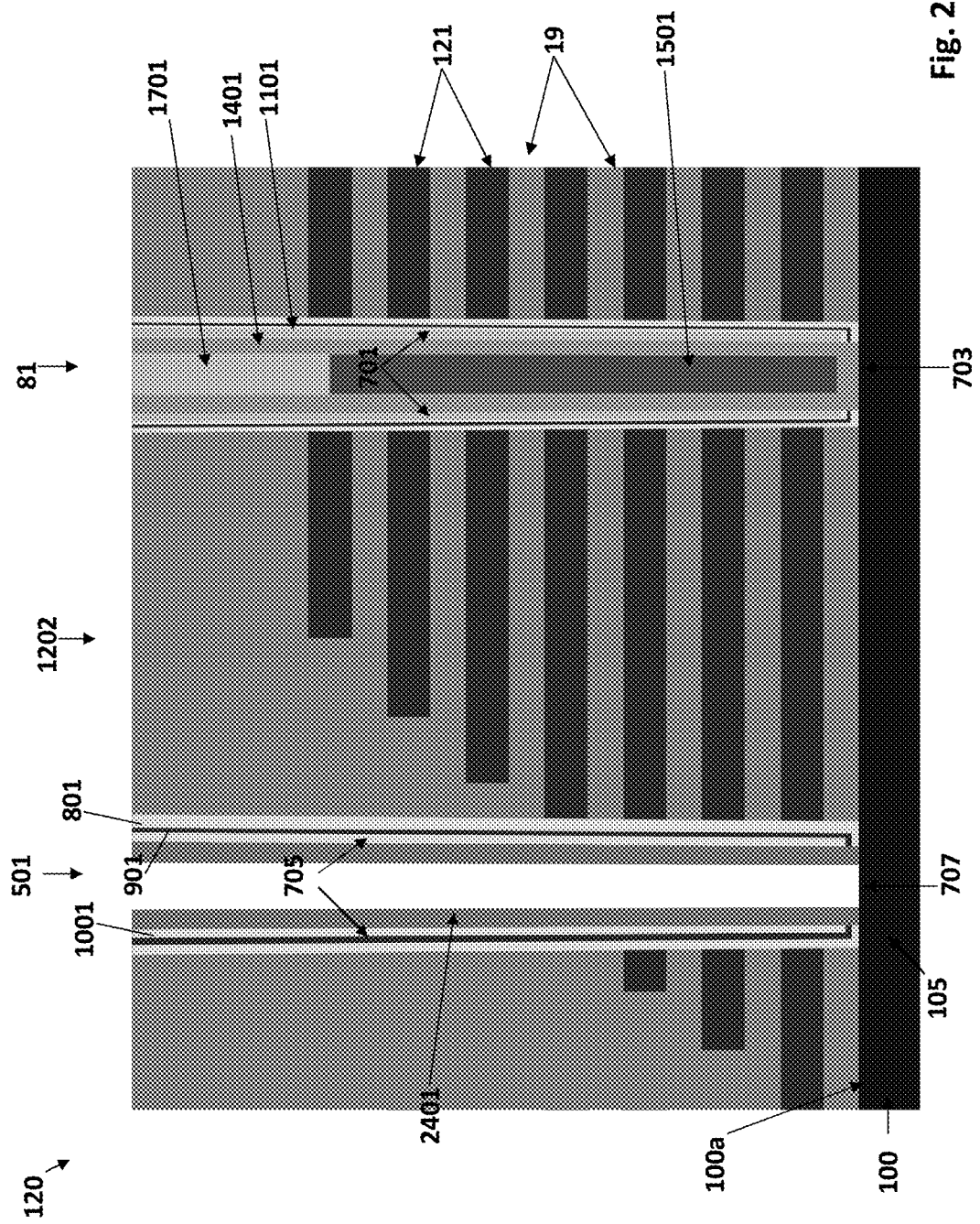

Referring to FIG. 25, a directional etching process (e.g., RIE) may be used to remove the spacer insulator layer 2401 from the top surface 1202 of the stack 120 and from the bottom surface 707 of the support pillar opening 501 to expose the doped well region 105 of the substrate 100 at the bottom surface 707 of the support pillar opening 501. The spacer insulator layer 2401 may remain on the sidewall 705 of the support pillar opening 501.

Figure 26:
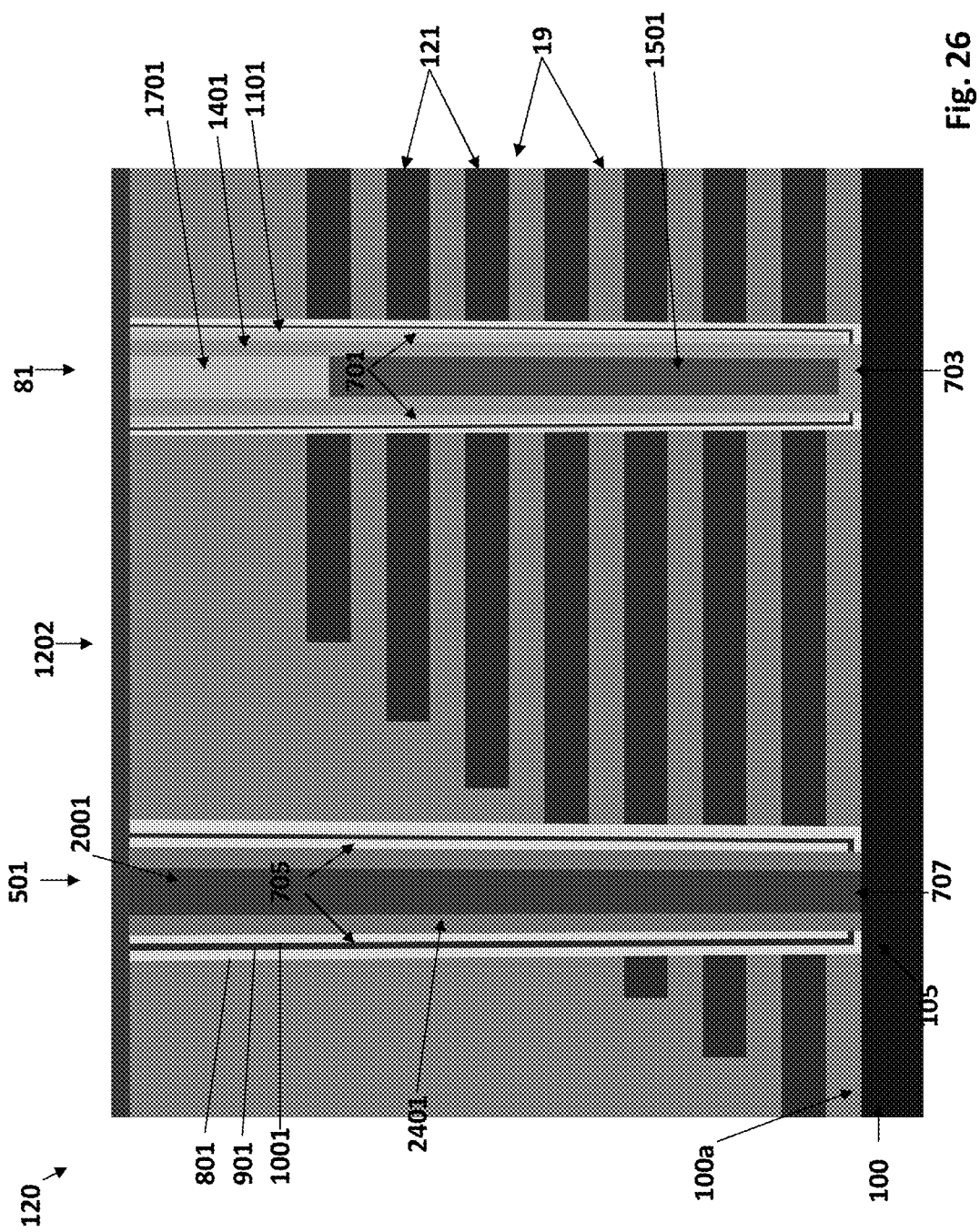
Figure 27:
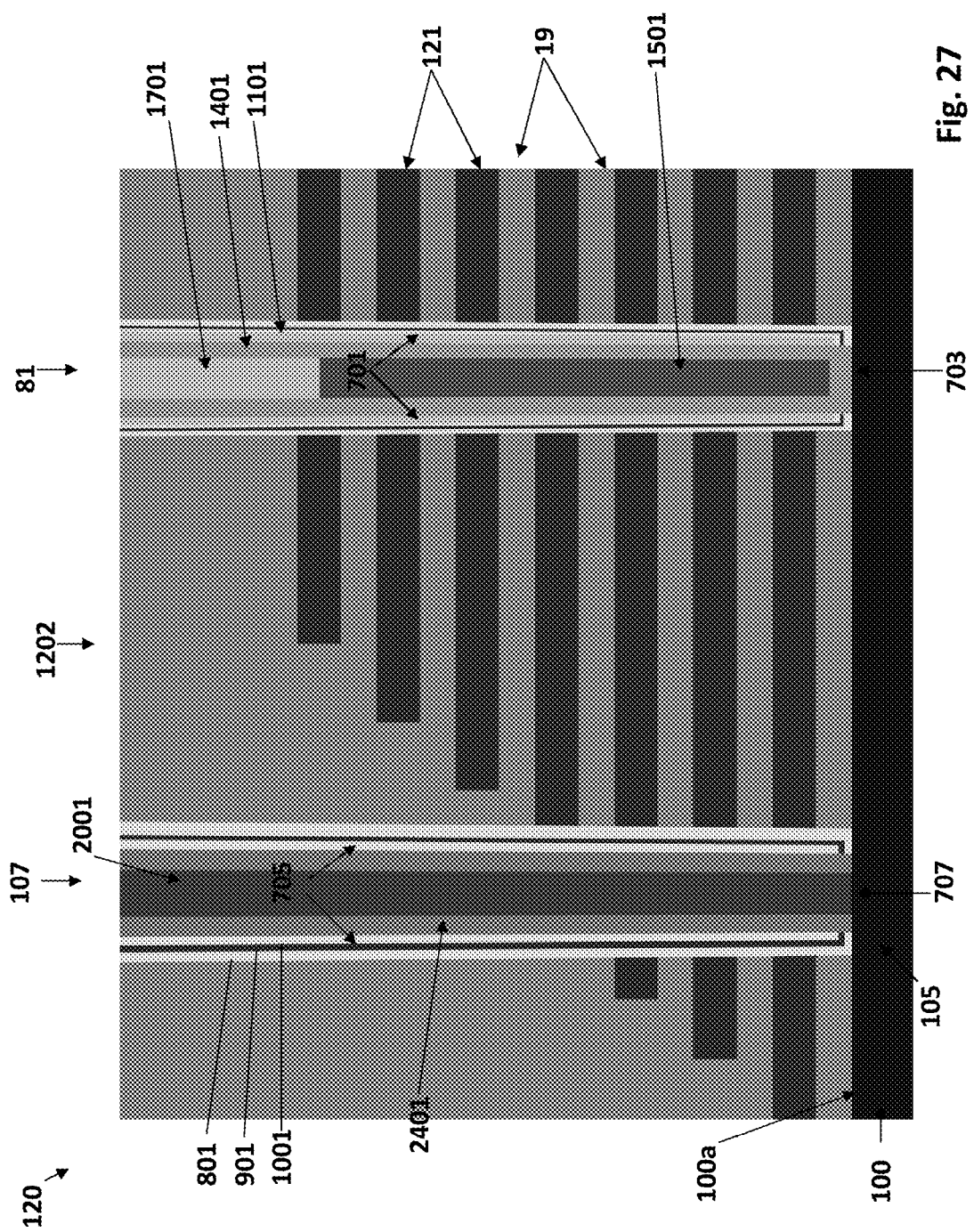

The method may then continue as described above with reference to FIGS. 20-23. Referring to FIG. 26, an electrically conductive material 2001 may be formed over the stack 120 and filling the support pillar opening 501, and the electrically conductive material 2001 may be removed from the top surface 1202 of the stack 120 as shown in FIG. 27. A gate replacement process such as shown in FIGS. 22-23 may be used to form the word lines/control gates 3.

Figure 28:
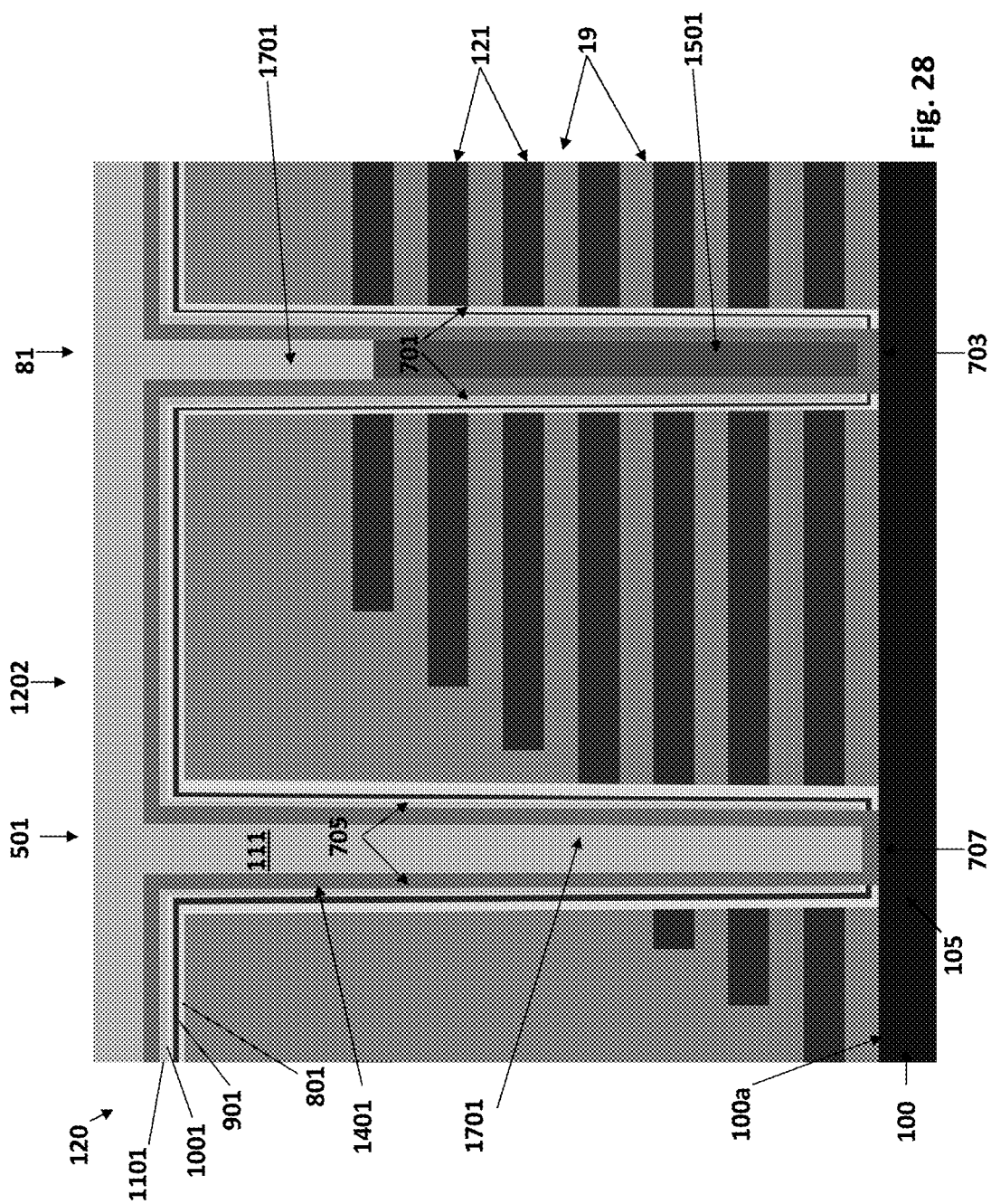
FIG. 28 is a side cross sectional view illustrating another embodiment method of making the device illustrated in FIGS. 1A-4D along line E-E' in FIG. 1B.

Another embodiment method of making a memory device having a support member 107 is shown in FIG. 28. This embodiment corresponds to FIG. 17, and shows the stack 120 after formation of the semiconductor material channel layer 1401 in contact with the doped well region 105 of the substrate 100 on the bottom surfaces 707, 703 of the support pillar opening 501 and the memory opening 81, respectively (see FIG. 14), the formation of the core insulator material 1501 within the support pillar opening 501 and the memory opening 81 (see FIG. 15) and the removal of the core insulator material 1501 from the support pillar opening 501 and the top portion 1601 of the memory opening 81 (see FIG. 16). FIG. 28 differs from FIG. 17 in that the cap layer 1701 of semiconductor material (e.g., polysilicon or amorphous silicon) is formed completely filling the support pillar opening 501 (i.e., there is no hollow core 1703 interior of the cap layer 1701 in the support pillar opening in the embodiment of FIG. 28). In addition, channel layer 1401 may extend over the sidewall 705 and bottom surface 707 of the support pillar opening 501 as shown in FIG. 28.

In this embodiment, the semiconductor cap layer 1701 and the channel layer 1401 may form the conductive core material 111 of the support member 107. This embodiment may be used, for example, when the semiconductor material of layers 1701 and 1401 has a low enough resistance to provide adequate electrical contact with the doped well region 105 of the substrate 100.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A monolithic three dimensional memory device, comprising:
    a semiconductor substrate having a major surface and a doped well region of a first conductivity type extending substantially parallel to the major surface of the semiconductor substrate;
    a plurality of NAND memory strings extending substantially perpendicular to the major surface of the semiconductor substrate;
    a plurality of substantially pillar-shaped support members extending substantially perpendicular to the major surface of the semiconductor substrate, each support member comprising an electrically insulating outer material surrounding an electrically conductive core material that extends substantially perpendicular to the major surface of the semiconductor substrate and electrically contacting the doped well region; and
    a plurality of electrically conductive word lines extending substantially parallel to the major surface of the semiconductor substrate and adjacent to the support members, wherein the word lines comprise or are electrically continuous with a plurality of control gate electrodes of the NAND memory strings, the plurality of control gate electrodes comprising at least a first control gate electrode located in a first device level and a second control gate electrode located in a second device level located over the major surface of the substrate and below the first device level, wherein:

each of the plurality of NAND memory strings comprises a substantially pillar-shaped structure extending substantially perpendicular to the major surface of the semiconductor substrate, and each of the plurality of substantially-pillar shaped support members has a width that is greater than a width of the substantially pillar shaped NAND strings;

each of the NAND memory strings comprises:
- a semiconductor channel, at least one end portion of the semiconductor channel extending substantially perpendicular to the major surface of the semiconductor substrate,
- at least one charge storage region located adjacent to at least the first side surfaces of each of the control gate electrodes,
- a blocking dielectric located adjacent to at least the first side surfaces of each of the control gate electrodes and located between the at least one charge storage region and each of the control gate electrodes, and
- a tunnel dielectric located between the at least one charge storage region and the semiconductor channel;

the plurality of NAND strings and at least one support member are located in an active memory cell area of the memory device, wherein the active memory cell area is located between a pair of electrically conductive source lines extending in a first direction substantially parallel the major surface of the semiconductor substrate;

the doped well region comprises a p-well region; and each of the source lines comprises a source electrode that is electrically coupled via a source region to the semiconductor channel of at least one NAND string by a semiconductor channel portion that extends substantially parallel to the major surface of the semiconductor substrate and contacts the semiconductor channel from below the device levels.

2. The monolithic three dimensional memory device of claim 1, further comprising at least one drain electrode which contacts the semiconductor channel via a drain region from above the device levels, and at least one bit line which extends substantially perpendicular to the source electrode and which electrically contacts the at least one drain electrode.

3. The monolithic three dimensional memory device of claim 1, further comprising:
at least one electrically conductive shunt line extending in a second direction substantially parallel to the major surface of the semiconductor substrate and to the at least one bit line, wherein the second direction is substantially perpendicular to the first direction of the source electrode, and wherein the electrically conductive core of each of the plurality of support members electrically contacts the doped well region at a first end of the core and is electrically coupled to a shunt line at a second end of the core opposite the first end.

4. The monolithic three dimensional memory device of claim 3, wherein at least one support member is located between first and second sets of one or more NAND strings within the active memory cell area and the at least one support member extends through a plurality of vertically separated word line fingers under the at least one electrically conductive shunt line.

5. The monolithic three dimensional memory device of claim 4, wherein at least one additional support member is further located in a word line connection region containing a plurality of word line contacts which contact respective stepped portions of the plurality of electrically conductive word lines.

6. The monolithic three dimensional memory device of claim 1, wherein at least one support member is located in a word line connection region containing a plurality of word line contacts which contact respective stepped portions of the plurality of electrically conductive word lines.

7. The monolithic three dimensional memory device of claim 1, wherein:
the substrate comprises a silicon substrate;
the plurality of NAND strings comprise a monolithic, three dimensional array of NAND strings;
at least one memory cell in the first device level of the three dimensional array of NAND strings is located over another memory cell in the second device level of the three dimensional array of NAND strings; and
the silicon substrate contains located thereon an integrated circuit comprising a driver circuit for the array of NAND strings.

8. A monolithic three dimensional memory device, comprising:
a semiconductor substrate having a major surface and a doped well region of a first conductivity type extending substantially parallel to the major surface of the semiconductor substrate;
a plurality of NAND memory strings extending substantially perpendicular to the major surface of the semiconductor substrate;
a plurality of substantially pillar-shaped support members extending substantially perpendicular to the major surface of the semiconductor substrate, each support member comprising an electrically insulating outer material surrounding an electrically conductive core material that extends substantially perpendicular to the major surface of the semiconductor substrate and electrically contacting the doped well region; and
a plurality of electrically conductive word lines extending substantially parallel to the major surface of the semiconductor substrate and adjacent to the support members, wherein the word lines comprise or are electrically continuous with a plurality of control gate electrodes of the NAND memory strings, the plurality of control gate electrodes comprising at least a first control gate electrode located in a first device level and a second control gate electrode located in a second device level located over the major surface of the substrate and below the first device level, wherein:
each of the plurality of NAND memory strings comprises a substantially pillar-shaped structure extending substantially perpendicular to the major surface of the semiconductor substrate, and each of the plurality of substantially-pillar shaped support members has a width that is greater than a width of the substantially pillar shaped NAND strings; and
at least one substantially pillar-shaped support member among the plurality of substantially pillar-shaped support members is located in a word line connection region containing a plurality of word line contacts which contact respective stepped portions of the plurality of electrically conductive word lines.

9. The monolithic three dimensional memory device of claim 8, wherein each of the NAND memory strings comprises:
- a semiconductor channel, at least one end portion of the semiconductor channel extending substantially perpendicular to the major surface of the semiconductor substrate;
- at least one charge storage region located adjacent to at least the first side surfaces of each of the control gate electrodes;
- a blocking dielectric located adjacent to at least the first side surfaces of each of the control gate electrodes and located between the at least one charge storage region and each of the control gate electrodes; and
- a tunnel dielectric located between the at least one charge storage region and the semiconductor channel.

10. The monolithic three dimensional memory device of claim 9, wherein the plurality of NAND strings and at least one support member are located in an active memory cell area of the memory device, wherein the active memory cell area is located between a pair of electrically conductive source lines extending in a first direction substantially parallel the major surface of the semiconductor substrate.

11. The monolithic three dimensional memory device of claim 10, wherein:
- the doped well region comprises a p-well region; and
- each of the source lines comprises a source electrode that is electrically coupled via a source region to the semiconductor channel of at least one NAND string by a semiconductor channel portion that extends substantially parallel to the major surface of the semiconductor substrate and contacts the semiconductor channel from below the device levels.

12. The monolithic three dimensional memory device of claim 11, further comprising at least one drain electrode which contacts the semiconductor channel via a drain region from above the device levels, and at least one bit line which extends substantially perpendicular to the source electrode and which electrically contacts the at least one drain electrode.

13. The monolithic three dimensional memory device of claim 10, further comprising:
- at least one electrically conductive shunt line extending in a second direction substantially parallel to the major surface of the semiconductor substrate and to the at least one bit line, wherein the second direction is substantially perpendicular to the first direction of the source electrode, and wherein the electrically conductive core of each of the plurality of support members electrically contacts the doped well region at a first end of the core and is electrically coupled to a shunt line at a second end of the core opposite the first end.

14. The monolithic three dimensional memory device of claim 13, wherein at least one support member is located between first and second sets of one or more NAND strings within the active memory cell area and the at least one support member extends through a plurality of vertically separated word line fingers under the at least one electrically conductive shunt line.

15. The monolithic three dimensional memory device of claim 14, wherein at least one additional support member is further located in a word line connection region containing a plurality of word line contacts which contact respective stepped portions of the plurality of electrically conductive word lines.

16. The monolithic three dimensional memory device of claim 8, wherein:
- the substrate comprises a silicon substrate;
- the plurality of NAND strings comprise a monolithic, three dimensional array of NAND strings;
- at least one memory cell in the first device level of the three dimensional array of NAND strings is located over another memory cell in the second device level of the three dimensional array of NAND strings; and
- the silicon substrate contains located thereon an integrated circuit comprising a driver circuit for the array of NAND strings.

17. A monolithic three dimensional memory device, comprising:
- a semiconductor substrate having a major surface and a doped well region of a first conductivity type extending substantially parallel to the major surface of the semiconductor substrate;
- a plurality of NAND memory strings extending substantially perpendicular to the major surface of the semiconductor substrate;
- a plurality of substantially pillar-shaped support members extending substantially perpendicular to the major surface of the semiconductor substrate, each support member comprising an electrically insulating outer material surrounding an electrically conductive core material that extends substantially perpendicular to the major surface of the semiconductor substrate and electrically contacting the doped well region;
- a plurality of electrically conductive word lines extending substantially parallel to the major surface of the semiconductor substrate and adjacent to the support members, wherein the word lines comprise or are electrically continuous with a plurality of control gate electrodes of the NAND memory strings, the plurality of control gate electrodes comprising at least a first control gate electrode located in a first device level and a second control gate electrode located in a second device level located over the major surface of the substrate and below the first device level; and
- at least one electrically conductive shunt line extending in a second direction substantially parallel to the major surface of the semiconductor substrate and to the at least one bit line, wherein the second direction is substantially perpendicular to the first direction of the source electrode, and wherein the electrically conductive core of each of the plurality of support members electrically contacts the doped well region at a first end of the core and is electrically coupled to a shunt line at a second end of the core opposite the first end;

wherein:
- each of the plurality of NAND memory strings comprises a substantially pillar-shaped structure extending substantially perpendicular to the major surface of the semiconductor substrate, and each of the plurality of substantially-pillar shaped support members has a width that is greater than a width of the substantially pillar shaped NAND strings;
- each of the NAND memory strings comprises:
  - a semiconductor channel, at least one end portion of the semiconductor channel extending substantially perpendicular to the major surface of the semiconductor substrate,
  - at least one charge storage region located adjacent to at least the first side surfaces of each of the control gate electrodes,
  - a blocking dielectric located adjacent to at least the first side surfaces of each of the control gate electrodes and located between the at least one charge storage region and each of the control gate electrodes, and a tunnel dielectric located between the at least one charge storage region and the semiconductor channel; and the plurality of NAND strings and at least one support member are located in an active memory cell area of the memory device, wherein the active memory cell area is located between a pair of electrically conductive source lines extending in a first direction substantially parallel the major surface of the semiconductor substrate.

* * * * *